(12) United States Patent  (10) Patent No.: US 6,794,111 B2
Nishi et al.  (45) Date of Patent: Sep. 21, 2004

(54) POLYMERS, RESIST COMPOSITIONS AND PATTERNING PROCESS, NOVEL TETRAHYDROFURAN COMPOUNDS AND THEIR PREPARATION

(75) Inventors: Tsunehiro Nishi, Nakakubiki-gun (JP); Takeshi Kinsho, Nakakubiki-gun (JP); Seiichiro Tachibana, Nakakubiki-gun (JP); Takeru Watanabe, Nakakubiki-gun (JP); Koji Hasegawa, Nakakubiki-gun (JP); Tomohiro Kobayashi, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 122 days.

(21) Appl. No.: 10/126,877

(22) Filed: Apr. 22, 2002

(65) Prior Publication Data

US 2002/0197559 A1 Dec. 26, 2002

(30) Foreign Application Priority Data

Apr. 23, 2001 (JP) .......................... 2001-124126
Apr. 23, 2001 (JP) .......................... 2001-124137

(51) Int. Cl.$^7$ ............................................... G03C 1/492
(52) U.S. Cl. .................... 430/270.1; 430/905; 430/910; 430/322; 430/330; 560/116; 562/498
(58) Field of Search .............................. 430/270.1, 905, 430/910, 322, 330; 560/116; 562/498

(56) References Cited

U.S. PATENT DOCUMENTS

| 4,288,642 A | * | 9/1981 | Yamanaka et al. .......... 568/903 |
| 2002/0150835 A1 | * | 10/2002 | Nishi et al. .............. 430/270.1 |
| 2003/0013039 A1 | * | 1/2003 | Kobayashi et al. ....... 430/270.1 |

OTHER PUBLICATIONS

"The conversion of Acylic Carbohydrates to tetrahydrofuran derivatives. The acid–catalyzed dehydration of tetritols and pentitols", B.G. Hudson and Robert Barker, Journal of Organic Chemistry, vol. 32, 3650–3658, Nov. 1967.*

* cited by examiner

Primary Examiner—Yvette C. Thornton
(74) Attorney, Agent, or Firm—Millen, White, Zelano & Branigan, P.C.

(57) ABSTRACT

A polymer comprising recurring units of formula (1-1) or (1-2) wherein $R^1$, $R^2$, $R^3$ and $R^4$ are H or alkyl, or $R^1$ and $R^2$, and $R^3$ and $R^4$ taken together may form a ring with each pair being alkylene, and k is 0 or 1 and having a Mw of 1,000–500,000 is novel. A resist composition comprising the polymer as a base resin is sensitive to high-energy radiation, has excellent sensitivity, resolution, etching resistance, and minimized swell and lends itself to micropatterning with electron beams or deep-UV.

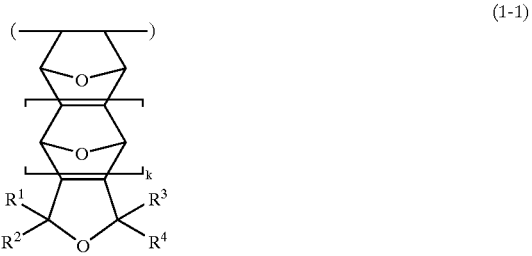

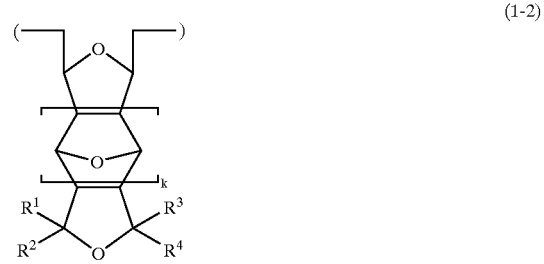

26 Claims, No Drawings

POLYMERS, RESIST COMPOSITIONS AND PATTERNING PROCESS, NOVEL TETRAHYDROFURAN COMPOUNDS AND THEIR PREPARATION

This invention relates to (i) a polymer comprising specific recurring units, (ii) a resist composition comprising the polymer as a base resin, (iii) a patterning process using the resist composition, (iv) a novel tetrahydrofuran compound useful as a monomer to form the polymer, and (v) a method for preparing the tetrahydrofuran compound.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 μm or less.

For resist materials for use with a KrF excimer lasers, polyhydroxystyrene having a practical level of transmittance and etching resistance is, in fact, a standard base resin. For resist materials for use with ArF excimer lasers, polyacrylic or polymethacrylic acid derivatives and polymers containing aliphatic cyclic compounds in the backbone are under investigation. All these polymers have advantages and disadvantages, and none of them have been established as the standard base resin.

More particularly, resist compositions using derivatives of polyacrylic or polymethacrylic acid have the advantages of high reactivity of acid-decomposable groups and good substrate adhesion and give relatively satisfactory results with respect to sensitivity and resolution, but have extremely low etching resistance and are impractical because the resin backbone is weak. On the other hand, resist compositions using polymers containing alicyclic compounds in their backbone have a practically acceptable level of etching resistance because the resin backbone is robust, but are very low in sensitivity and resolution because the reactivity of acid-decomposable protective groups is extremely low as compared with those on the (meth)acrylic polymers. Since the backbone of the resin is too robust, substrate adhesion is poor. These compositions are thus impractical as well.

Both the (meth)acrylic and alicyclic backbone systems commonly have the problem of pattern disruption due to swelling of resist film. Resist compositions based on these systems have been designed so as to improve their resolution performance by increasing the difference in dissolution rate before and after exposure, and as a consequence, they eventually become highly hydrophobic. Highly hydrophobic resist compositions, when applied as a film and processed with a developer, can maintain the film tenaciously in unexposed regions and allow the film to be instantaneously dissolved in over-exposed regions, while relatively-broad exposed regions therebetween allow penetration of the developer, but are kept undissolved, that is, swollen. At the very small pattern size for which an ArF excimer laser is actually used, those resist compositions which allow adjacent pattern strips to be joined together and disrupted on account of swelling are rejected. While a finer pattern rule is being demanded, there is a need to have a resist material which is not only satisfactory in sensitivity, resolution, and etching resistance, but fully restrained from swelling.

SUMMARY OF THE INVENTION

Therefore, an object of the present invention is to provide (i) a polymer having improved reactivity, robustness and substrate adhesion as well as minimized swell during development, (ii) a resist composition comprising the polymer as a base resin, which has a higher resolution and etching resistance than conventional resist compositions, (iii) a patterning process using the resist composition, (iv) a novel tetrahydrofuran compound useful as a monomer to form the polymer, and (v) a method for preparing the tetrahydrofuran compound.

It has been found that novel polymers comprising recurring units of the following general formula (1-1) or (1-2) and having a weight average molecular weight of 1,000 to 500,000, which are produced by the method to be described later, have improved reactivity, robustness or rigidity and substrate adhesion as well as an appropriately high solubility and minimized swell in a developer; that a resist composition comprising the polymer as the base resin has a high resolution and etching resistance; and that this resist composition lends itself to precise micropatterning.

In a first aspect, the invention provides a polymer comprising recurring units of the following general formula (1-1) or (1-2) and having a weight average molecular weight of 1,000 to 500,000.

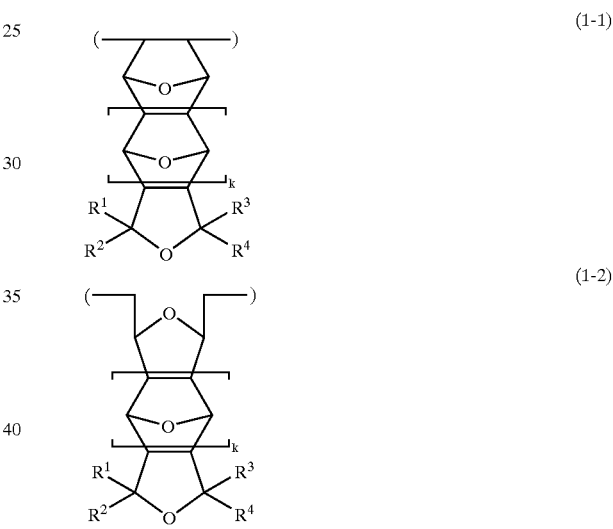

Herein each of $R^1$, $R^2$, $R^3$ and $R^4$ is hydrogen or a straight, branched or cyclic alkyl group of 1 to 15 carbon atoms, or a pair of $R^1$ and $R^2$ and a pair of $R^3$ and $R^4$ taken together may form a ring wherein each said pair is a straight, branched or cyclic alkylene group of 2 to 15 carbon atoms and k is equal to 0 or 1.

In one preferred embodiment, the polymer includes, in addition to the recurring units of formula (1-1), recurring units of the following general formula (2-1).

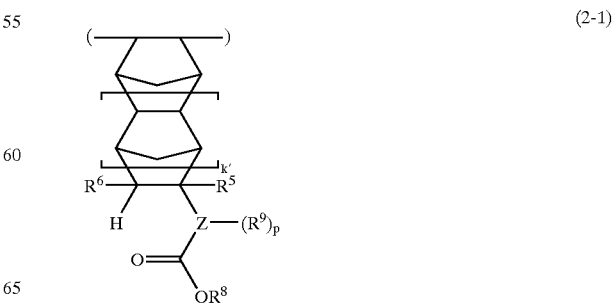

Herein $R^5$ is hydrogen, methyl or $CH_2CO_2R^7$; $R^6$ is hydrogen, methyl or $CO_2R^7$; $R^7$ which may be identical or different in $R^5$ and $R^6$ is a straight, branched or cyclic alkyl group of 1 to 15 carbon atoms; $R^8$ is an acid labile group; $R^9$ is selected from the class consisting of a halogen atom, a hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some or all of the hydrogen atoms on constituent carbon atoms may be substituted with halogen atoms; Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone; k' is 0 or 1; and p is 0, 1 or 2.

In another preferred embodiment, the polymer includes, in addition to the recurring units of formula (1-1), recurring units of the following general formulae (2-1) and (3).

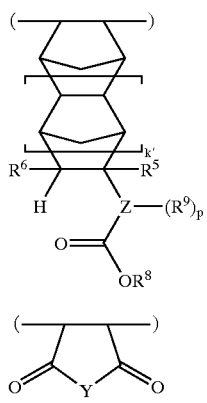

(2-1)

(3)

Herein k', p and $R^5$ to $R^9$ are as defined above, Y is —O— or —$NR^{10}$—, and $R^{10}$ is hydrogen or a straight, branched or cyclic alkyl group of 1 to 15 carbon atoms.

In a further preferred embodiment, the polymer includes, in addition to the recurring units of formula (1-1), recurring units of the following general formula (4) alone or in combination with recurring units of the following general formula (2-1), and recurring units of the following general formula (3).

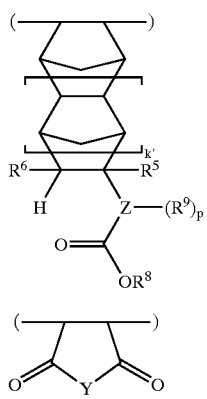

(2-1)

(3)

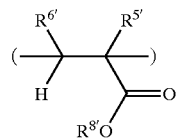

(4)

Herein k', p, $R^5$ to $R^9$ and Y are as defined above, $R^{5'}$ is hydrogen, methyl or $CH_2CO_2R^{7'}$, $R^{6'}$ is hydrogen, methyl or $CO_2R^{7'}$, $R^{7'}$ which may be identical or different in $R^{5'}$ and $R^{6'}$ is a straight, branched or cyclic alkyl group of 1 to 15 carbon atoms, and $R^{8'}$ is an acid labile group.

In a still further preferred embodiment, the polymer includes, in addition to the recurring units of formula (1-2), recurring units of the following general formula (2-2).

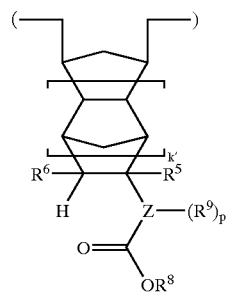

(2-2)

Herein k', p and $R^5$ to $R^9$ are as defined above.

In a second aspect, the invention provides a resist composition comprising the polymer defined above.

In a third aspect, the invention provides a process for forming a resist pattern comprising the steps of applying the resist composition onto a substrate to form a coating; heat treating the coating and then exposing it to high-energy radiation or electron beams through a photo mask; and optionally heat treating the exposed coating and developing it with a developer.

In a fourth aspect, the invention provides a tetrahydrofuran compound of the following general formula (5).

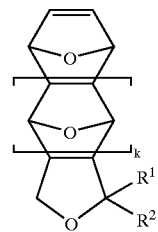

(5)

Herein $R^1$, $R^2$ and k are as defined above.

The tetrahydrofuran compound is preferably of the following general formula (6).

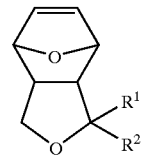

(6)

Herein $R^1$ and $R^2$ are as defined above.

In a fifth aspect, the invention provides a method for preparing a tetrahydrofuran compound of the following general formula (5), comprising the step (a) of subjecting a diol compound of the following general formula (7) to intramolecular dehydration.

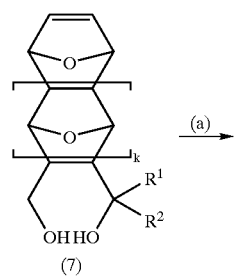

(7)

Herein $R^1$, $R^2$ and k are as defined above, and step (a) represents dehydration reaction.

In an alternative embodiment, a tetrahydrofuran compound of the following general formula (5) is prepared by converting a diol compound of the following general formula (7) to a compound having an eliminatable group X of the following general formula (8-1) and/or (8-2), and treating the compound with a base for cyclization.

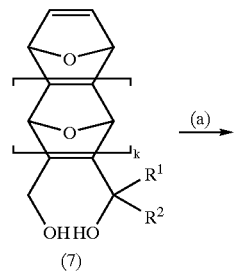

(7)

and/or

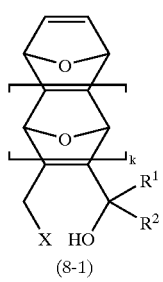

(8-1)

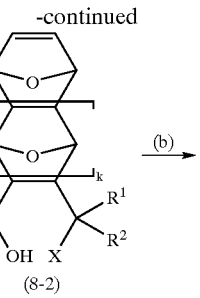

(8-2)

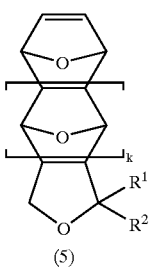

(5)

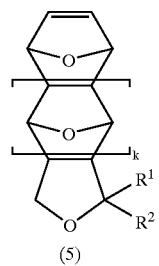

(5)

Herein $R^1$, $R^2$ and k are as defined above, X is halogen, alkylsulfonyloxy or arylsulfonyloxy, step (a) represents halogen-substitution reaction, alkylsulfonylation reaction or arylsulfonylation reaction on hydroxyl, and step (b) represents HX-eliminating reaction.

The polymer comprising recurring units of formula (1-1) or (1-2) has high robustness due to the inclusion of a bridged aliphatic ring in the backbone. As opposed to a polar group introduced at a site spaced apart from the backbone, a highly polar ether site positioned within the backbone allows for rapid transition from the penetration of a developer to the dissolution of the resin, during which period little swelling occurs. In addition, since small amounts of the recurring units of formula (1-1) or (1-2) introduced are sufficient to fully exert the swell suppressing effect and the substrate bonding effect, the units for establishing differential dissolution rate such as blocked carboxylic acid units can be introduced in relatively large amounts, eventually enhancing sensitivity and resolution. Therefore, a resist composition using the inventive polymer as a base resin satisfies all the performance factors of sensitivity, resolution and etching resistance, is fully restrained from swelling upon development, and is thus very useful in forming micropatterns.

DESCRIPTION OF THE PREFERRED
EMBODIMENTS

Polymer

Polymers or high molecular weight compounds comprising recurring units of the following general formula (1-1) or (1-2) according to the invention are novel. The polymers have a weight average molecular weight of 1,000 to 500,000.

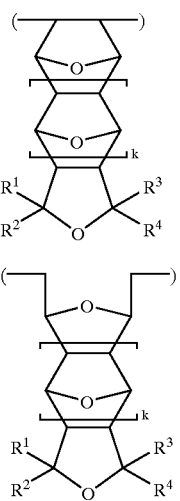

(1-1)

(1-2)

Herein each of $R^1$, $R^2$, $R^3$ and $R^4$ is hydrogen or a straight, branched or cyclic alkyl group of 1 to 15 carbon atoms. Suitable alkyl groups include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl. A pair of $R^1$ and $R^2$ and a pair of $R^3$ and $R^4$ taken together may form a ring. In that event, the combination of $R^1$ with $R^2$ and the combination of $R^3$ with $R^4$ each are a straight, branched or cyclic alkylene group of 2 to 15 carbon atoms, such as ethylene, trimethylene, tetramethylene and pentamethylene as well as other alkylene groups obtained by eliminating one hydrogen atom from the above-exemplified alkyl groups. The subscript k is equal to 0 or 1.

More specifically, the polymers of the invention are divided into the following four subgenuses of polymers.

Subgenus (I) include polymers comprising, in addition to the recurring units of formula (1-1), recurring units of the following general formula (2-1).

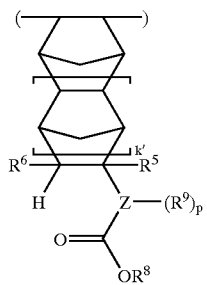

(2-1)

Herein $R^5$ is hydrogen, methyl or $CH_2CO_2R^7$; $R^6$ is hydrogen, methyl or $CO_2R^7$; $R^7$ which may be identical or different in $R^5$ and $R^6$ is a straight, branched or cyclic alkyl group of 1 to 15 carbon atoms; $R^8$ is an acid labile group; $R^9$ is selected from among a halogen atom, a hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some or all of the hydrogen atoms on constituent carbon atoms may be substituted with halogen atoms; Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone; k' is 0 or 1; and p is 0, 1 or 2.

Subgenus (II) include polymers comprising, in addition to the recurring units of formula (1-1), recurring units of the following general formulae (2-1) and (3).

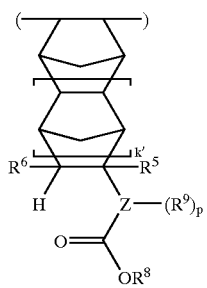

(2-1)

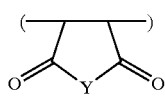

(3)

Herein k', p and $R^5$ to $R^9$ are as defined above, Y is —O— or —(NR$^{10}$)—, and $R^{10}$ is hydrogen or a straight, branched or cyclic alkyl group of 1 to 15 carbon atoms.

Subgenus (III) include polymers comprising, in addition to the recurring units of formula (1-1), recurring units of the following general formula (4) alone or in combination with recurring units of the following general formula (2-1), and recurring units of the following general formula (3).

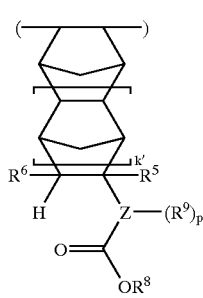

(2-1)

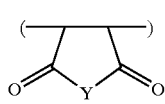

(3)

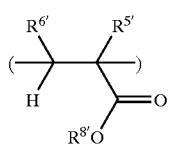

(4)

Herein k', p, $R^5$ to $R^9$ and Y are as defined above, $R^{5'}$ is hydrogen, methyl or $CH_2CO_2R^{7'}$, $R^{6'}$ is hydrogen, methyl or $CO_2R^{7'}$, $R^{7'}$ which may be identical or different in $R^{5'}$ and $R^{6'}$ is a straight, branched or cyclic alkyl group of 1 to 15 carbon atoms, and $R^{8'}$ is an acid labile group.

Subgenus (IV) include polymers comprising, in addition to the recurring units of formula (1-2), recurring units of the following general formula (2-2).

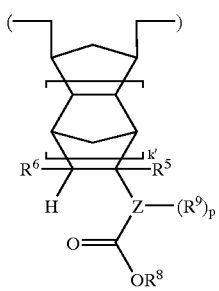

(2-2)

Herein k', p and $R^5$ to $R^9$ are as defined above.

More particularly, $R^5$ is hydrogen, methyl or $CH_2CO_2R^7$, and $R^{5'}$ is hydrogen, methyl or $CH_2CO_2R^{7'}$. $R^6$ is hydrogen, methyl or $CO_2R^7$, and $R^{6'}$ is hydrogen, methyl or $CO_2R^{7'}$. $R^7$ and $R^{7'}$ which may be identical or different between $R^5$ and $R^6$ and between $R^{5'}$ and $R^{6'}$, respectively, stand for straight, branched or cyclic alkyl groups of 1 to 15 carbon atoms, such as, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl. $R^8$ and $R^{8'}$ stand for acid labile groups to be described later.

$R^9$ is selected from among a halogen atom, a hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some or all of the hydrogen atoms on constituent carbon atoms may be substituted with halogen atoms. Exemplary of $R^9$ are fluoro, chloro, bromo, hydroxyl, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, ethylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichloroacetoxy, 2,2, 2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy, and tert-butoxycarbonyloxy.

Y is —O— or —(NR$^{10}$)— wherein $R^{10}$ is hydrogen or a straight, branched or cyclic alkyl group of 1 to 15 carbon atoms, examples of which are as exemplified for $R^7$ and $R^{7'}$.

Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone. In case of p=0, for example, exemplary Z groups are methylene, ethylene, trimethylene, tetramethylene, pentamethylene, hexamethylene, 1,2-propanediyl, 1,3-butanediyl, 1-oxo-2-oxapropane-1,3-diyl, and 3-methyl-1-oxo-2-oxabutane-1,4-diyl. In case of p≠0, exemplary Z groups are (p+2)-valent groups obtained by eliminating one or two hydrogen atoms from the above-exemplified groups.

The acid labile groups represented by $R^8$ and $R^{8'}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

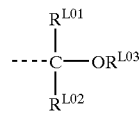

(L1)

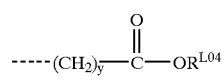

(L2)

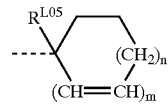

(L3)

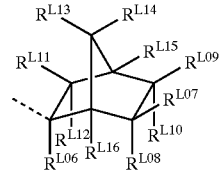

(L4)

In these formulae and throughout the specification, the broken line denotes a free valence bond. $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

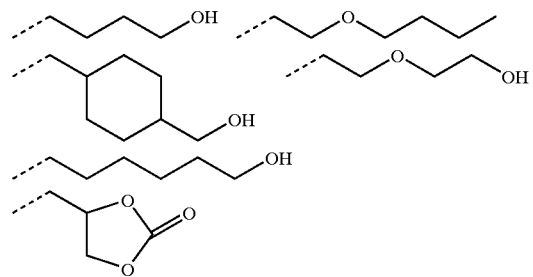

A pair of $R^{L01}$ and $R^{L02}$, $R^{L03}$ and $R^{L03}$, or $R^{L02}$ and $R^{L03}$ may form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl) propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2- cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

$R^{L05}$ is a monovalent hydrocarbon group of 1 to 8 carbon atoms which may contain a hetero atom or a substituted or unsubstituted aryl group of 6 to 20 carbon atoms. Examples of the monovalent hydrocarbon group which may contain a hetero atom include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted groups in which some hydrogen atoms on the foregoing groups are substituted with hydroxyl, alkoxy, carboxy, alkoxycarbonyl, oxo, amino, alkylamino, cyano, mercapto, alkylthio, sulfo or other groups. Exemplary aryl groups are phenyl, methylphenyl, naphthyl, anthryl, phenanthryl, and pyrenyl. Letter m is equal to 0 or 1, n is equal to 0, 1, 2 or 3, and 2m+n is equal to 2 or 3.

$R^{L06}$ is a monovalent hydrocarbon group of 1 to 8 carbon atoms which may contain a hetero atom or a substituted or unsubstituted aryl group of 6 to 20 carbon atoms. Examples of these groups are the same as exemplified for $R^{L05}$.

$R^{L07}$ to $R^{L16}$ independently represent hydrogen or monovalent hydrocarbon groups of 1 to 15 carbon atoms which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$, taken together form a ring (for examples, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$–$C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L16}$ which are attached to adjoining carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

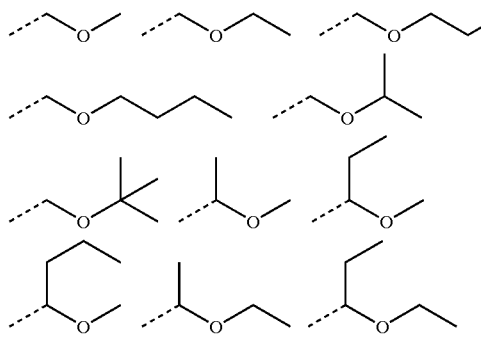

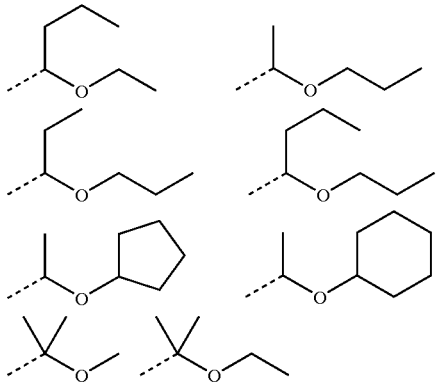

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyl-oxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are exemplified by the following groups.

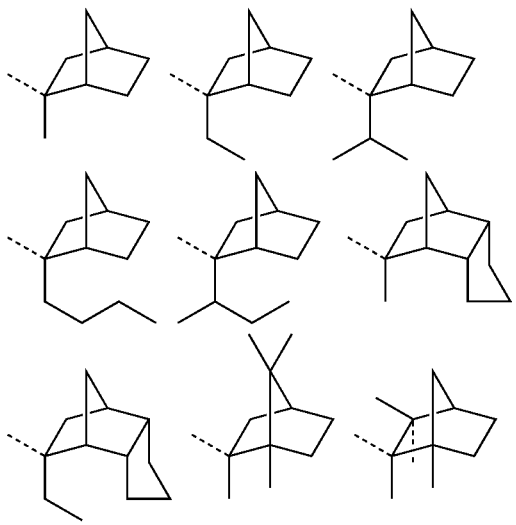

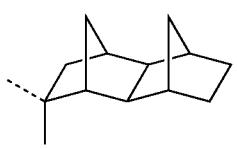

Examples of the tertiary alkyl groups of 4 to 20 carbon atoms, trialkylsilyl groups in which each alkyl moiety has 1 to 6 carbon atoms, and oxoalkyl groups of 4 to 20 carbon atoms are as exemplified for $R^{L04}$.

Illustrative, non-limiting, examples of the recurring units of formula (1-1) are given below.

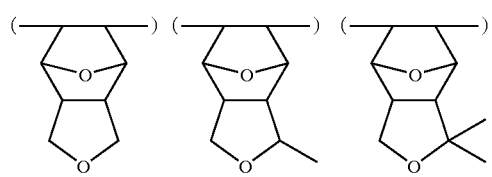

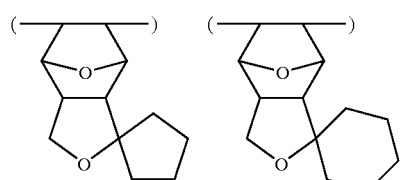

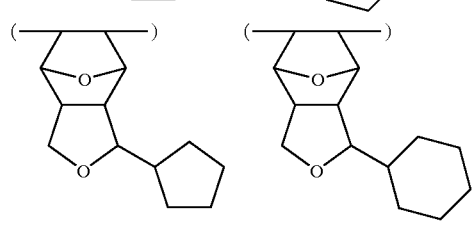

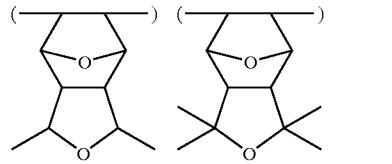

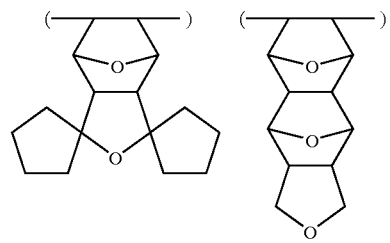

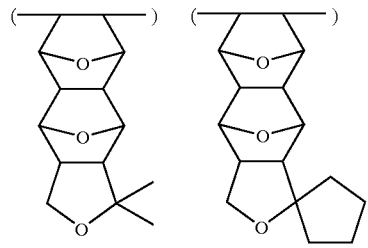

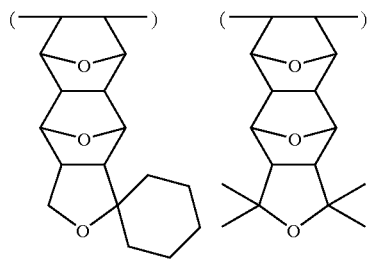

Illustrative, non limiting, examples of the recurring units of formula (1-2) are given below

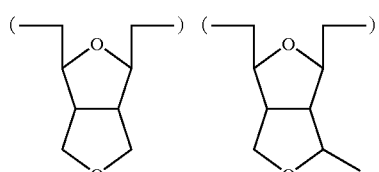

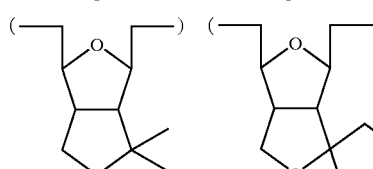

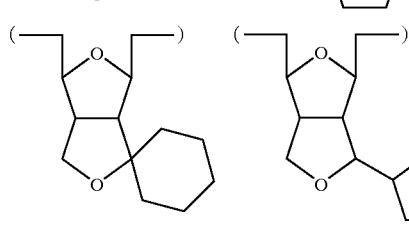

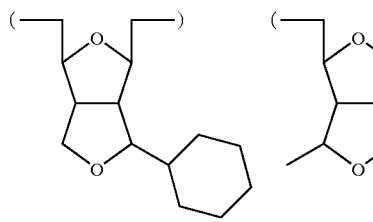

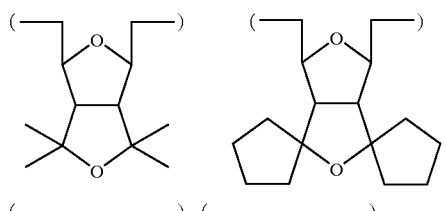

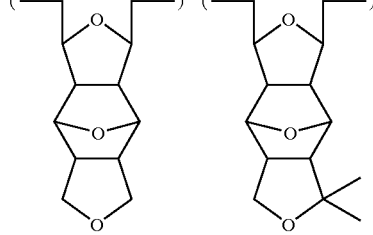

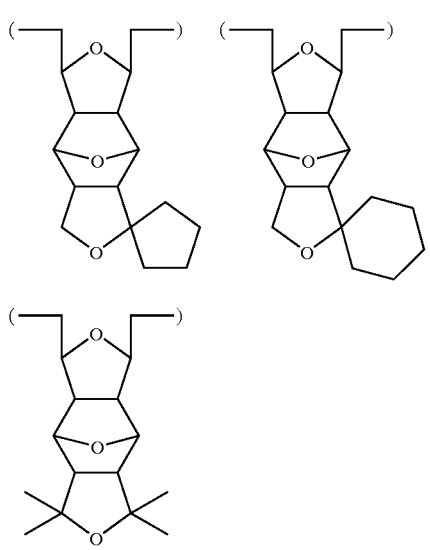
Illustrative, non-limiting, examples of the recurring units of formula (2-1) are given below.
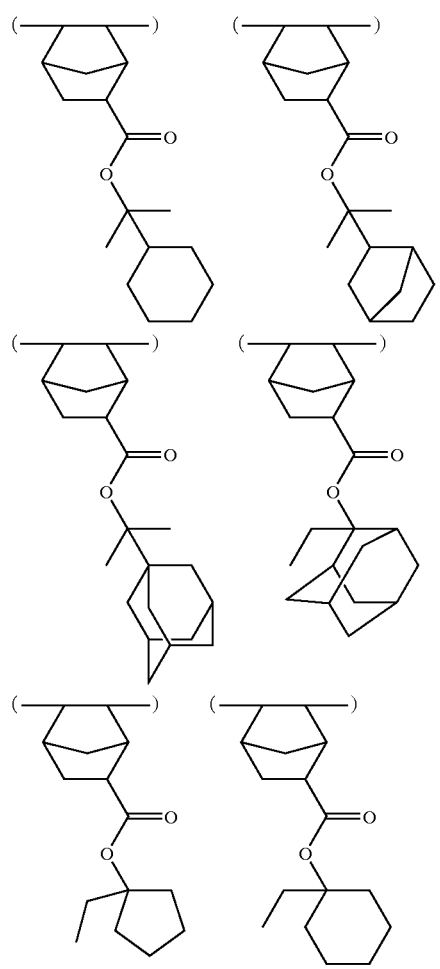
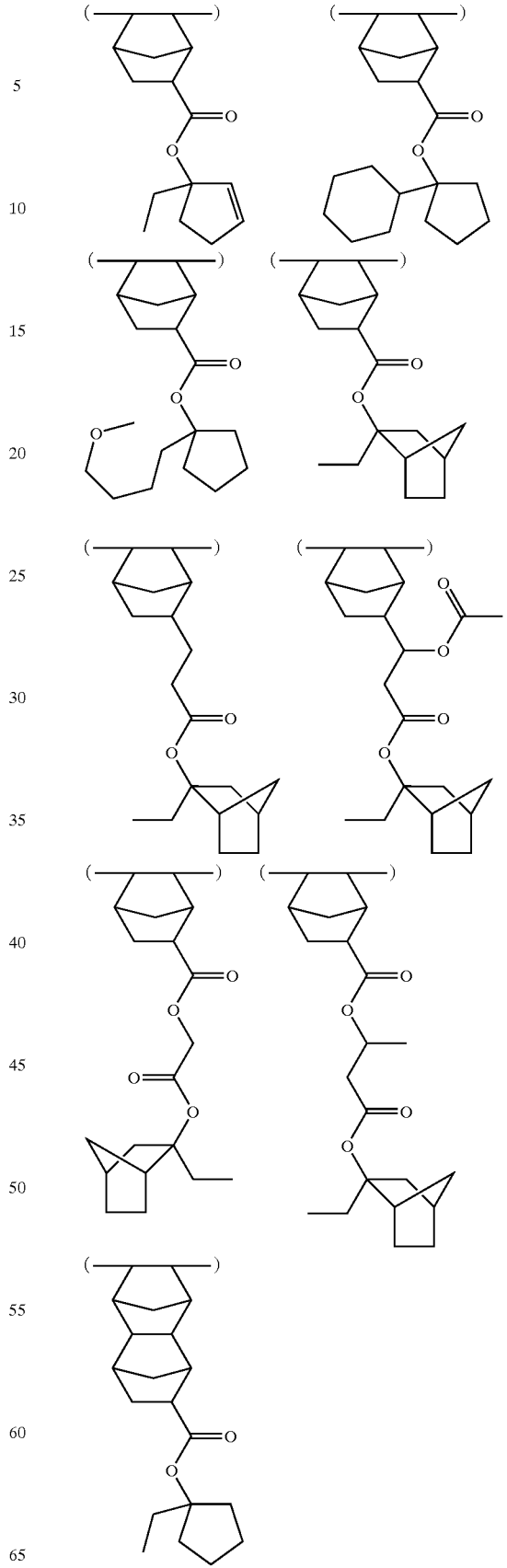

Illustrative, non-limiting, examples of the recurring units of formula (2-2) are given below.
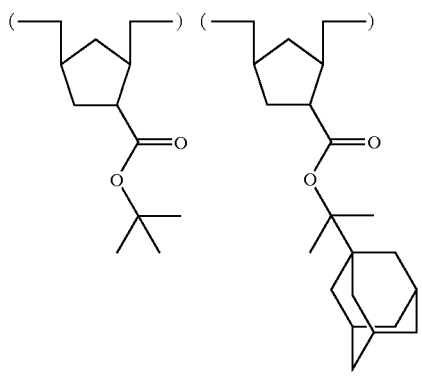
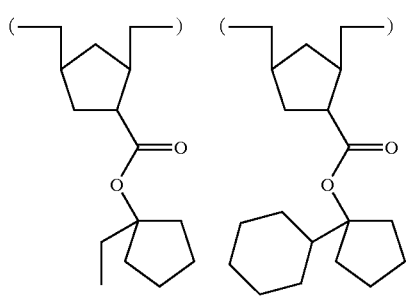
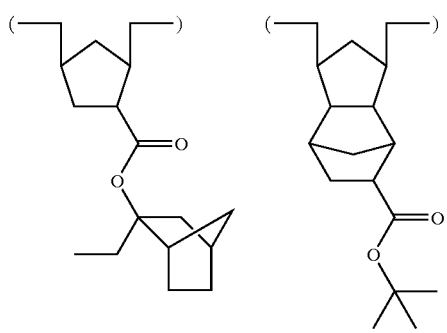
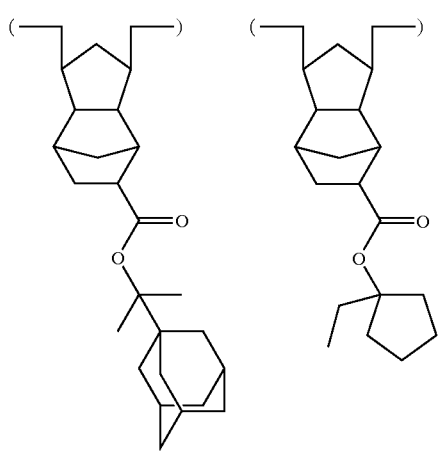
-continued
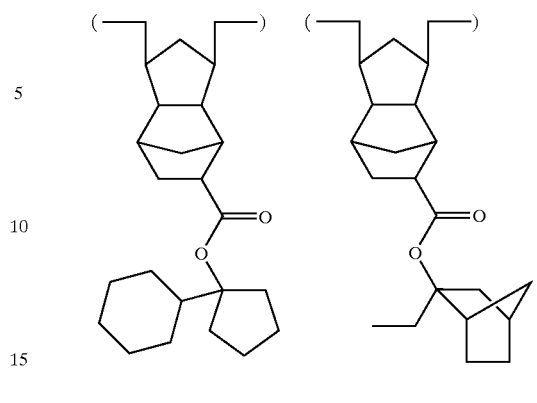
Illustrative, non-limiting, examples of the recurring units of formula (4) are given below.
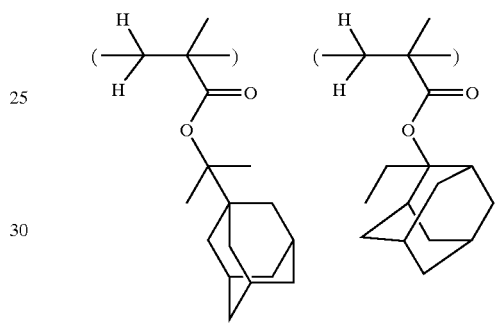
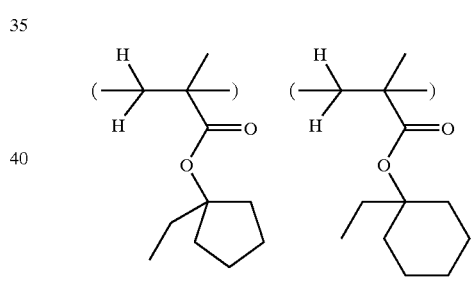
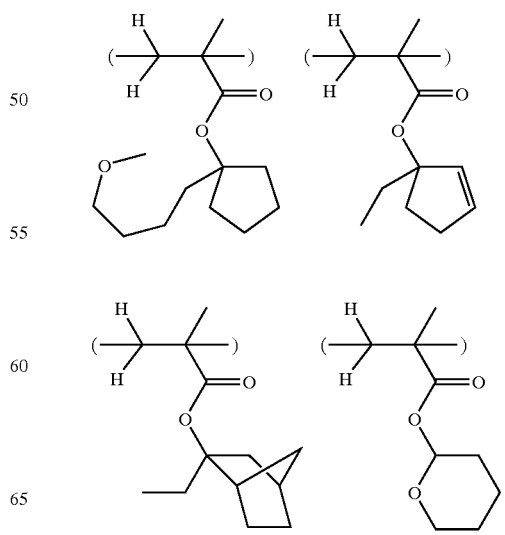

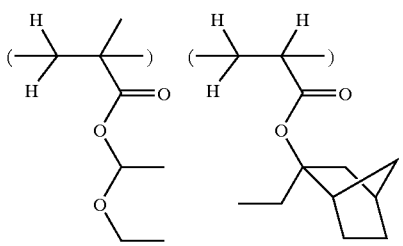

If desired, the polymers of the invention may further contain recurring units of one or more types selected from units of the following general formulae (M1) to (M8-2).

(M1)
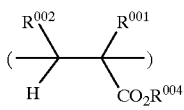

(M2)
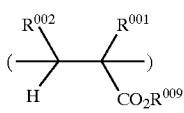

(M3)
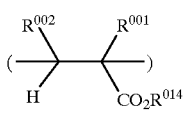

(M4)
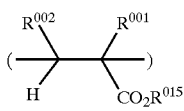

(M5-1)
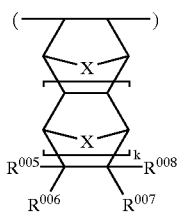

(M6-1)
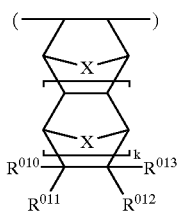

(M7-1)
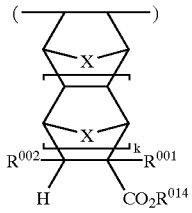

(M8-1)
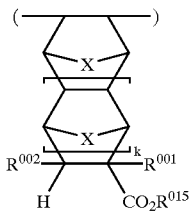

(M5-2)
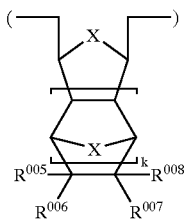

(M6-2)
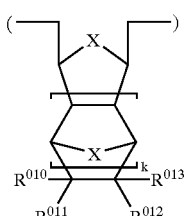

(M7-2)
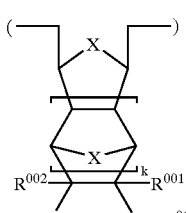

(M8-2)
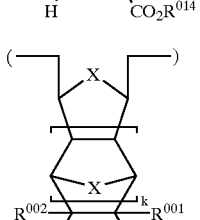

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 2 to 15 carbon atoms containing at least one partial structure selected from among ether, aldehyde, ketone, ester, carbonate, acid anhydride, amide and imide. At least one of $R^{010}$ to $R^{013}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. X is $CH_2$ or an oxygen atom. Letter k is equal to 0 or 1.

More illustratively, $R^{003}$ is a straight, branched or cyclic alkyl group of 1 to 15 carbon atoms, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having a carboxyl or hydroxyl group, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Examples of the carboxyl or hydroxyl-bearing monovalent hydrocarbon group of 1 to 15 carbon atoms include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic alkyl group of 1 to 15 carbon atoms are the same as exemplified for $R^3$.

Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. Examples of the carboxyl or hydroxyl-bearing divalent hydrocarbon group of 1 to 15 carbon atoms include the groups exemplified as the carboxyl or hydroxyl-bearing monovalent hydrocarbon group, with one hydrogen atom eliminated therefrom. Examples of the straight, branched or cyclic alkylene groups of 1 to 15 carbon atoms include the groups exemplified for $R^{003}$, with one hydrogen atom eliminated therefrom.

$R^{009}$ is a monovalent hydrocarbon group of 2 to 15 carbon atoms containing at least one partial structure selected from among ether, aldehyde, ketone, ester, carbonate, acid anhydride, amide and imide, for example, methoxymethyl, methoxyethoxymethyl, 2-oxooxolan-3-yl, 2-oxooxolan-4-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. Examples of the monovalent hydrocarbon group of 2 to 15 carbon atoms containing at least one partial structure selected from among ether, aldehyde, ketone, ester, carbonate, acid anhydride, amide and imide include methoxymethyl, methoxymethoxymethyl, formyl, methylcarbonyl, formyloxy, acetoxy, pivaloyloxy, formyloxymethyl, acetoxy-methyl, pivaloyloxymethyl, methoxycarbonyl, 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic alkyl groups of 1 to 15 carbon atoms are the same as exemplified for $R^{003}$.

$R^{010}$ to $R^{013}$, taken together, may form a ring, and in that event, at least one of $R^{010}$ to $R^{013}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. Examples of the divalent hydrocarbon group of 1 to 15 carbon atoms containing at least one partial structure selected from among ether, aldehyde, ketone, ester, carbonate, acid anhydride, amide and imide include 2-oxapropane-1,3-diyl, 1,1-dimethyl-2-oxapropane-1,3-diyl, 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group of 1 to 15 carbon atoms containing at least one partial structure selected from among ether, aldehyde, ketone, ester, carbonate, acid anhydride, amide and imide, with one hydrogen atom eliminated therefrom. Examples of the straight, branched or cyclic alkylene groups of 1 to 15 carbon atoms include the groups exemplified for $R^{003}$, with one hydrogen atom eliminated therefrom.

$R^{014}$ is a polycyclic hydrocarbon group having 7 to 15 carbon atoms or an alkyl group containing a polycyclic hydrocarbon group, for example, norbornyl, bicyclo[3.3.1]-nonyl, tricyclo[$5.2.1.0^{2,6}$]decyl, adamantyl, ethyladamantyl, butyladamantyl, norbornylmethyl, and adamantylmethyl.

$R^{015}$ is an acid labile group, examples of which are the same as described above. X is $CH_2$ or an oxygen atom. Letter k is equal to 0 or 1.

The recurring units of formulae (M1) to (M8-2) are effective for imparting such desired properties as developer affinity, substrate adhesion and etching resistance to a resist composition based on a polymer comprising these recurring units. By adjusting the content of these recurring units, the performance of the resist composition can be finely adjusted.

The polymers of the invention have a weight average molecular weight of about 1,000 to 500,000, preferably about 3,000 to 100,000, as measured by gel permeation chromatography (GPC) using a polystyrene standard. Outside the range, the etching resistance may become extremely low and the resolution may become low because a substantial difference in rate of dissolution before and after exposure is lost.

The polymer of the invention can be prepared through copolymerization reaction using a compound of the following general formula (1a) as a first monomer, one, two or three members selected from compounds of the following general formulae (2a) to (4a) as second to fourth monomers, and optionally, one or more members selected from compounds of the following general formulae (M1a) to (M8a) as subsequent monomers.

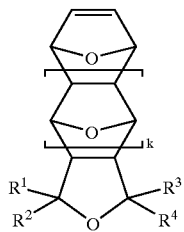
(1a)

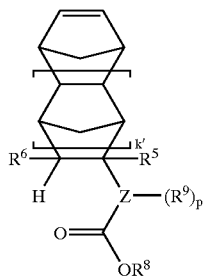
(2a)

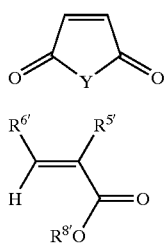
(3a)

(4a)

Herein, k, k', p, $R^1$ to $R^9$, $R^{5'}$ to $R^{8'}$ and Y are as defined above.

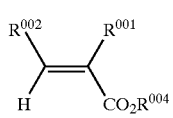
(M1a)

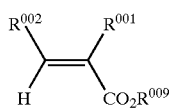
(M2a)

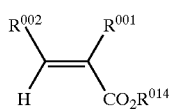
(M3a)

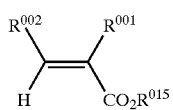
(M4a)

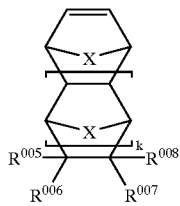
(M5a)

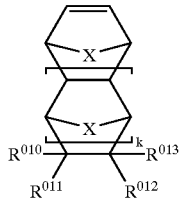
(M6a)

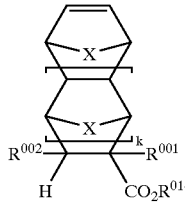
(M7a)

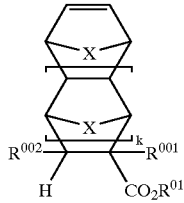
(M8a)

Herein, k, $R^{001}$ to $R^{015}$, and X are as defined above.

By properly adjusting the proportion of the respective monomers used in the copolymerization reaction, the polymer can be tailored so that it may exert the preferred performance when blended in resist compositions.

In addition to (i) the monomer of formula (1a), (ii) the monomer or monomers of formulas (2a) to (4a), and (iii) the monomer or monomers of formulae (M1a) to (M8a), the polymer of the invention may have copolymerized therewith (iv) another monomer having a carbon-to-carbon double bond other than (i) to (iii). Examples of the additional monomer (iv) include substituted acrylic acid esters such as methyl methacrylate, methyl crotonate, dimethyl maleate, and dimethyl itaconate, unsaturated carboxylic acids such as maleic acid, fumaric acid and itaconic acid, substituted or unsubstituted norbornenes such as norbornene and methyl norbornene-5-carboxylate, and unsaturated acid anhydrides such as itaconic anhydride.

In the polymers of the invention, the preferred proportion of recurring units based on the respective monomers is in the following range (in mol %), though not limited thereto.

(I) When the polymer is comprised of recurring units of formula (1-1) and recurring units of formula (2-1), it contains (i) 1 to 90%, preferably 5 to 80%, and more preferably 10 to 70% of recurring units of formula (1-1) based on the monomer of formula (1a), (ii) 1 to 90%, preferably 5 to 80%, and more preferably 10 to 70% of recurring units of formula (2-1) based on the monomer of formula (2a), (iii) 0 to 50%, preferably 0 to 40%, and more preferably 0 to 30% of recurring units of formula (M5-1) to (M8-1) based on the monomers of formula (M5a) to (M8a), and (iv) 0 to 50%, preferably 0 to 40%, and more preferably 0 to 30% of recurring units based on another monomer.

(II) When the polymer is comprised of recurring units of formula (1-1), recurring units of formula (2-1) and recurring units of formula (3), it contains (i) 1 to 49%, preferably 3 to 45%, and more preferably 5 to 40% of recurring units of formula (1-1) based on the monomer of formula (1a), (ii) 1 to 49%, preferably 3 to 45%, and more preferably 5 to 40% of recurring units of formula (2-1) based on the monomer of formula (2a), (iii) 50 mol % of recurring units of formula (3) based on the monomer of formula (3a), (iv) 0 to 25%, preferably 0 to 20%, and more preferably 0 to 15% of recurring units of formula (M5-1) to (M8-1) based on the monomers of formula (M5a) to (M8a), and (v) 0 to 25%, preferably 0 to 20t, and more preferably 0 to 15% of recurring units based on another monomer.

(III) When the polymer is comprised of recurring units of formula (1-1), recurring units of formula (4) alone or in combination with recurring units of formula (2-1), and recurring units of formula (3), it contains (i) 1 to 49%, preferably 3 to 45%, and more preferably 5 to 40% of recurring units of formula (1-1) based on the monomer of formula (1a), (ii) 0 to 40%, preferably 0 to 35%, and more preferably 0 to 30% of recurring units of formula (2-1) based on the monomer of formula (2a), (iii) 1 to 80%, preferably 1 to 70%, and more preferably 1 to 50% of recurring units of formula (4) based on the monomer of formula (4a), (iv) 1 to 49%, preferably 5 to 45%, and more preferably 10 to 40% of recurring units of formula (3) based on the monomer of formula (3a), (v) 0 to 25%, preferably 0 to 20%, and more preferably 0 to 15% of recurring units of formula (M1) to (M8-1) based on the monomers of formula (M1a) to (M8a), and (vi) 0 to 25%, preferably 0 to 20%, and more preferably 0 to 15% of recurring units based on another monomer.

(IV) When the polymer is comprised of recurring units of formula (1-2) and recurring units of formula (2-2), it contains (i) 1 to 90%, preferably 5 to 80%, and more preferably 10 to 70% of recurring units of formula (1-2) based on the monomer of formula (1a), (ii) 1 to 90%, preferably 5 to 80%, and more preferably 10 to 70% of recurring units of formula (2-2) based on the monomer of formula (2a), (iii) 0 to 50%, preferably 0 to 40%, and more preferably 0 to 30% of recurring units of formula (M5-2) to (M8-2) based on the monomers of formula (M5a) to (M8a), and (iv) 0 to 50%, preferably 0 to 40%, and more preferably 0 to 30% of recurring units based on another monomer.

A variety of copolymerization reaction methods may be used for the preparation of the polymer according to the invention. The preferred polymerization reaction is radical polymerization, anionic polymerization or coordination polymerization.

For radical polymerization, preferred reaction conditions include (a) a solvent selected from among hydrocarbons such as benzene, ethers such as tetrahydrofuran, alcohols such as ethanol, and ketones such as methyl isobutyl ketone, (b) a polymerization initiator selected from azo compounds such as 2,2'-azobisisobutyronitrile and peroxides such as benzoyl peroxide and lauroyl peroxide, (c) a temperature of about 0° C. to about 100° C., and (d) a time of about ½ hour to about 48 hours. Reaction conditions outside the described range may be employed if desired.

For anionic polymerization, preferred reaction conditions include (a) a solvent selected from among hydrocarbons such as benzene, ethers such as tetrahydrofuran, and liquid ammonia, (b) a polymerization initiator selected from metals such as sodium and potassium, alkyl metals such as n-butyllithium and sec-butyllithium, ketyl, and Grignard reagents, (c) a temperature of about −78° C. to about 0° C., (d) a time of about ½ hour to about 48 hours, and (e) a stopper selected from among proton-donative compounds such as methanol, halides such as methyl iodide, and electrophilic compounds. Reaction conditions outside the described range may be employed if desired.

For coordination polymerization, preferred reaction conditions include (a) a solvent selected from among hydrocarbons such as n-heptane and toluene, (b) a catalyst selected from Ziegler-Natta catalysts comprising a transition metal (e.g., titanium) and alkylaluminum, Phillips catalysts of metal oxides having chromium or nickel compounds carried thereon, and olefin-metathesis mixed catalysts as typified by tungsten and rhenium mixed catalysts, (c) a temperature of about 0° C. to about 100° C., and (d) a time of about ½ hour to about 48 hours. Reaction conditions outside the described range may be employed if desired.

The monomer from which the units of formulae (1-1) and (1-2) characteristic of the inventive polymers are derived can be synthesized by first effecting Diels-Alder reaction of maleic anhydride with a furan to form 4,10-dioxatricyclo[5.2.1.0$^{2,6}$]dec-8-ene-3,5-dione or 6,14,15-trioxapentacyclo[9.2.1.1$^{3,9}$.0$^{2,10}$.0$^{4,8}$]pentadec-12-ene-5,7-dione, then effecting nucleophilic addition reaction to carbonyl group such as Grignard reaction or reduction of the acid anhydride moiety with a hydride reducing agent or the like and subsequent cyclization reaction, or combination thereof.

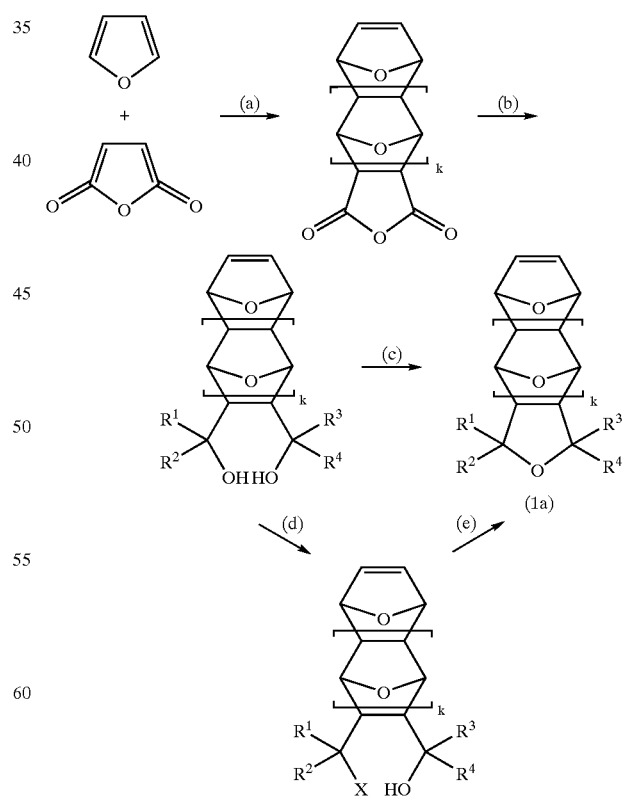

Herein, k and $R^1$ to $R^4$ are as defined above, and X is a halogen atom, alkylsulfonyloxy group or arylsulfonyloxy group. Step (a) represents Diels-Alder reaction; step (b) represents reduction with hydride reducing agents or the like, nucleophilic addition reaction such as Grignard reaction or a combination thereof; step (c) represents intramolecular dehydrating cyclization reaction with acids, salts or phosphorus compounds; step (d) represents halogenation or sulfonylation reaction; and step (e) represents dehydrohalogenation or desulfonation reaction.

Tetrahydrofuran Compound

The starting monomer from which the inventive polymer is produced is preferably a tetrahydrofuran compound of the following general formula (5), more preferably a tetrahydrofuran compound of the following general formula (6). Accordingly, the present invention provides novel tetrahydrofuran compounds and a method for preparing the same.

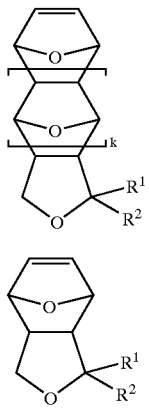

(5)

(6)

Herein $R^1$, $R^2$ and k are as defined above. Illustrative examples of these groups are the same as exemplified above.

Preferably the preparation of the tetrahydrofuran compound according to the invention starts with a diol compound of the following general formula (7), which in turn, is readily obtained by reduction of a corresponding lactone (9) or acid anhydride (10).

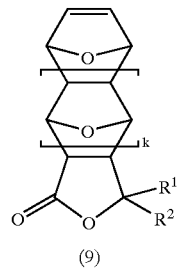 and/or 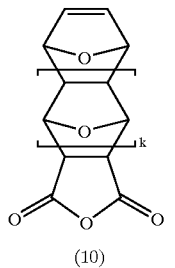

(9)                    (10)

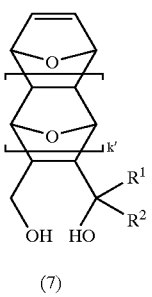

(7)

Herein $R^1$, $R^2$ and k are as defined above. Step (a) represents reducing reaction.

A first method of preparing the tetrahydrofuran compound (5) from the diol compound (7) is by intramolecular dehydration of the diol compound (7).

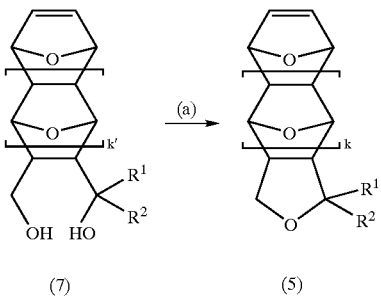

(7)                    (5)

Herein $R^1$, $R^2$ and k are as defined above, and step (a) represents dehydration reaction.

Better results are obtained from intramolecular dehydration reaction when an acid or a salt thereof, or a phosphorus reagent is used.

Examples of the acid used herein include inorganic acids such as hydrochloric acid, hydrobromic acid, sulfuric acid, nitric acid, perchloric acid, and phosphoric acid and organic acids such as formic acid, acetic acid, oxalic acid, Adbenzoic acid, p-toluenesulfonic acid, and benzenesulfonic acid, and salts thereof as well as cation-exchange resins. The amount of acid used is a catalytic amount, preferably 0.01 to 10 mol, especially 0.01 to 0.5 mol per mol of the diol compound (7). To remove the water formed upon tetrahydrofuran cyclization, it is recommended that the water be positively removed from the system by azeotropic distillation using a hydrocarbon such as n-hexane, n-heptane, benzene, toluene, xylene or cumene, for thereby accelerating the reaction. Also, the reaction may be carried out in vacuum.

Examples of the phosphorus reagent include hexamethylphosphoric triamide (HMPA), dialkyl azodicarboxylate-triphenylphosphine, triethylphosphine, and potassium carbonate-triphenylphosphine. The amount of phosphorus reagent used is preferably 0.9 to 10 mol, especially 1.0 to 1.2 mol per mol of the diol compound (7).

The reaction temperature and time vary with other conditions. In one example using triphenylsphosphine and carbon tetrachloride, the reaction temperature is room temperature to the reflux temperature, desirably 50° C. to the reflux temperature for rapidly driving the reaction to completion. The reaction time is desirably determined by monitoring the reaction until the completion by gas chromatography (GC) or silica gel thin-layer chromatography (TLC) because higher yields are expectable. The reaction time is usually about 1 to about 30 hours.

From the reaction mixture, the end tetrahydrofuran compound (5) is obtained by a conventional aqueous work-up step. If necessary, the end compound (5) is purified by any conventional technique such as distillation, chromatography or recrystallization.

A second method of preparing the tetrahydrofuran compound (5) from the diol compound (7) involves the step (a) of converting the diol compound (7) to a compound (8-1) and/or (8-2) having an eliminatable group such as a halogen atom, alkylsulfonyloxy group or arylsulfonyloxy group, and the step (b) of treating the compound (8-1) and/or (8-2) with a base for cyclization into a tetrahydrofuran compound

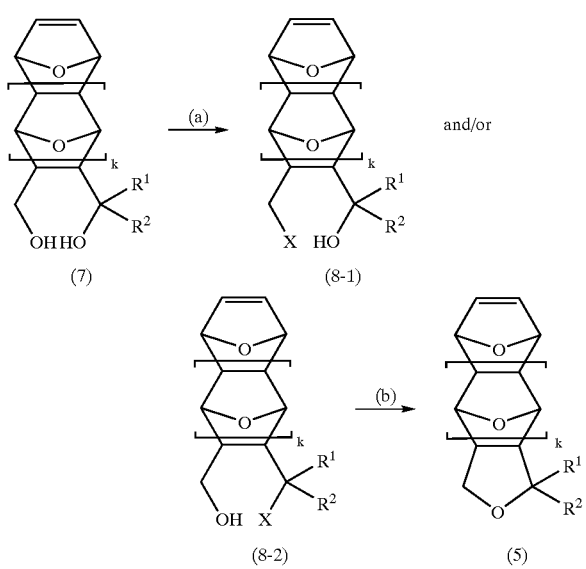

Herein, $R^1$, $R^2$ and k are as defined above, and X is a halogen atom, alkylsulfonyloxy group or arylsulfonyloxy group. Step (a) represents halogen-substitution reaction, alkylsulfonylation reaction or arylsulfonylation reaction on hydroxyl, and step (b) represents HX-eliminating reaction.

The first step is to synthesize the compound (8-1) and/or (8-2) having an eliminatable group. The compound (7) has within the molecule two hydroxyl groups, only one of which is converted to an eliminatable group X. When $R^1$ or $R^2$ is not hydrogen, that is, when either one or both of $R^1$ and $R^2$ are straight, branched or cyclic $C_{1-15}$ alkyl groups or $R^1$ and $R^2$ together are a straight, branched or cyclic $C_{2-15}$ alkylene group, one of the two hydroxyl groups is a primary hydroxyl group and the other is a secondary or tertiary hydroxyl group. It is then relatively easy to convert only one hydroxyl group to an eliminatable group X by utilizing a difference in reactivity between the two. In contrast, when both $R^1$ and $R^2$ are hydrogen, the two hydroxyl groups are both primary. Then the amounts of reagents and reaction conditions must be carefully determined in order to convert only one hydroxyl group to an eliminatable group X.

In the case of the compound (8-1) or (8-2) having an eliminatable group X which is a halogen atom, X is preferably chlorine or bromine. In this case, various well-known methods are applicable to the synthesis of haloalcohol compound (8-1) or (8-2) from diol compound (7). Some exemplary methods use hydrohalogenic acids such as hydrochloric acid and hydrobromic acid, sulfur reagents such as thionyl chloride and thionyl bromide, and phosphorus reagents such as phosphorus trichloride, phosphorus pentachloride, phosphorus tribromide or triphenylphosphine combined with various halogen sources.

The reaction temperature and time largely vary with reagents and conditions. In one example wherein a Vilsmeier reagent is prepared using phosphorus pentachloride in dimethylformamide (DMF) and reacted in situ to chlorinate one primary hydroxyl group, a temperature in the range of −20° C. to room temperature, desirably 0° C. to room temperature is preferred for high-selectivity of reaction. The reaction time is desirably determined by monitoring the reaction until the completion by gas chromatography (GC) or silica gel thin-layer chromatography (TLC) because higher yields are expectable. The reaction time is usually about 1 to about 50 hours.

From the reaction mixture, the end haloalcohol compound (8-1) and/or (8-2) is obtained by a conventional aqueous work-up step. If necessary, the compound (8-1) and/or (8-2) is purified by any conventional technique such as distillation, chromatography or recrystallization. In most cases, the crude product has such a purity that it may be used in the subsequent step without purification.

In the case of the compound (8-1) or (8-2) having an eliminatable group X which is an alkylsulfonyloxy or arylsulfonyloxy group, X is preferably a methanesulfonyloxy, trifluoromethanesulfonyloxy, benzenesulfonyloxy or p-toluenesulfonyloxy group for availability of their starting materials. In this case, the sulfonyloxy compound (8-1) or (8-2) is conventionally synthesized by reacting a corresponding sulfonyl halide with the diol compound (7) in a solvent in the presence of a base.

The sulfonyl halide is exemplified by methanesulfonyl chloride, trifluoromethanesulfonyl chloride, benzenesulfonyl chloride and p-toluenesulfonyl chloride. An appropriate amount of the sulfonyl halide used is 0.9 to 10 mol, especially 1.0 to 1.2 mol per mol of the diol compound (7) in order to convert only one of the hydroxyl groups on the diol compound (7) to X.

Examples of the base used herein include organic amines such as pyridine, triethylamine, N,N-dimethylaniline and 4-dimethylaminopyridine; alkoxides such as sodium methoxide, sodium ethoxide, lithium methoxide, lithium ethoxide, lithium tert-butoxide and potassium tert-butoxide; inorganic hydroxides such as sodium hydroxide, lithium hydroxide, potassium hydroxide, barium hydroxide and tetra-n-butylammonium hydroxide; inorganic carbonates such as sodium carbonate, sodium hydrogen carbonate, lithium carbonate and potassium carbonate; and metal amides such as sodium amide, potassium amide, lithium diisopropylamide, potassium diisopropylamide, lithium dicyclohexylamide, potassium dicyclohexylamide, lithium 2,2,6,6-tetramethyl-piperidine, lithium bistrimethylsilylamide, sodium bistrimethylsilylamide, potassium bistrimethylsilylamide, lithium isopropylcyclohexylamide and bromomagnesium diisopropylamide. An appropriate amount of the base used is 0.9 to 100 mol, especially 1.0 to 100 mol per mol of the diol compound (7). The base itself may also be used as a solvent.

Suitable solvents include ethers such as tetrahydrofuran, diethyl ether and di-n-butyl ether; chlorinated organic solvents such as methylene chloride and chloroform; hydrocarbons such as n-hexane, n-heptane, benzene, toluene, xylene and cumene; and aprotic polar solvents such as dimethyl sulfoxide and N,N-dimethylformamide. Depending on reaction conditions, a choice may be made among these solvents and mixtures thereof.

The reaction temperature and time largely vary with reagents and conditions. In one example wherein mono-p-toluene sulfonate is synthesized using p-toluenesulfonyl chloride and pyridine as the base and solvent, a temperature in the range of −20° C. to room temperature, desirably 0° C. to room temperature is preferred for the completion of reaction and the high purity of the reaction product. The reaction time is desirably determined by monitoring the reaction until the completion by gas chromatography (GC) or silica gel thin-layer chromatography (TLC) because higher yields are expectable. The reaction time is usually about 1 to about 60 hours.

From the reaction mixture, the end sulfonyloxy compound (8-1) and/or (8-2) is obtained by a conventional aqueous work-up step. If necessary, the compound (8-1) and/or (8-2) is purified by any conventional technique such as distillation, chromatography or recrystallization. In most cases, the crude product has such a purity that it may be used in the subsequent step without purification.

In a further embodiment, the compound (8-1) and/or (8-2) in which X is an alkylsulfonyloxy or arylsulfonyloxy group can be converted to the haloalcohol compound (8-1) and/or (8-2) in which X is halogen.

In this embodiment, reaction may be performed in a polar solvent such as dimethylformamide (DMF), dimethyl sulfoxide (DMSO) or ethanol at an elevated temperature in the range of room temperature to the reflux temperature of the solvent, using a halide salt such as lithium chloride, lithium bromide, sodium bromide or calcium bromide in more than stoichiometric amounts.

In the second step, a base acts on the compound (8-1) and/or (8-2) having an eliminatable group in a solvent to produce the end tetrahydrofuran compound. Examples of the base used herein include alkoxides such as sodium methoxide, sodium ethoxide, lithium methoxide, lithium ethoxide, lithium tert-butoxide and potassium tert-butoxide; organic amines such as pyridine, triethylamine, N,N-dimethylaniline and 4-dimethylaminopyridine; inorganic hydroxides such as sodium hydroxide, lithium hydroxide, potassium hydroxide, barium hydroxide and tetra-n-butylammonium hydroxide; inorganic carbonates such as sodium carbonate, sodium hydrogen carbonate, lithium carbonate and potassium carbonate; alkyl metal compounds such as trityllithium, tritylsodium, tritylpotassium, methyllithium, phenyllithium, sec-butyllithium, tert-butyllithium and ethyl magnesium bromide; and metal amides such as sodium amide, potassium amide, lithium diisopropylamide, potassium diisopropylamide, lithium dicyclohexylamide, potassium dicyclohexylamide, lithium 2,2,6,6-tetramethylpiperidine, lithium bistrimethylsilylamide, sodium bistrimethylsilylamide, potassium bistrimethylsilylamide, lithium isopropylcyclohexylamide and bromomagnesium diisopropylamide. In the event where compound (8-1) and/or (8-2) is synthesized in the first step using a base, it can be further converted to compound (5) without any additional measure. An appropriate amount of the base used is 0.9 to 100 mol, especially 1.0 to 100 mol per mol of the compound (8-1) and/or (8-2) having an eliminatable group.

Suitable solvents include water, ethers such as tetrahydrofuran, diethyl ether, di-n-butyl ether and 1,4-dioxane; hydrocarbons such as n-hexane, n-heptane, benzene, toluene, xylene and cumene; alcohols such as methanol, ethanol, isopropyl alcohol and tert-butyl alcohol; and aprotic polar solvents such as dimethyl sulfoxide and N,N-dimethylforamide. Depending on reaction conditions, a choice may be made among these solvents and mixtures thereof. The base itself may be used as the solvent.

The reaction temperature and time largely vary with reagents and conditions. In one example wherein cyclization reaction is performed under two-layer conditions using an aqueous sodium hydroxide solution and toluene, a temperature in the range of room temperature to 100° C., desirably 50 to 100° C. is preferred for the quick completion of reaction. The reaction time is desirably determined by monitoring the reaction until the completion by gas chromatography (GC) or silica gel thin-layer chromatography (TLC) because higher yields are expectable. The reaction time is usually about 1 to about 60 hours.

From the reaction mixture, the end tetrahydrofuran compound (5) is obtained by a conventional aqueous work-up step. If necessary, the compound (5) is purified by any conventional technique such as distillation, chromatography or recrystallization.

Resist Composition

Since the polymer of the invention is useful as the base resin of a resist composition, the other aspect of the invention provides a resist composition, especially a chemically amplified positive resist composition, comprising the polymer. Typically, the resist composition contains the polymer, a photoacid generator, and an organic solvent, and other optional components.

Photoacid Generator

The photoacid generator is a compound capable of generating an acid upon exposure to high energy radiation or electron beams and includes the following:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail. (i) Onium salts of formula (P1a-1), (P1a-2) or (P1b):

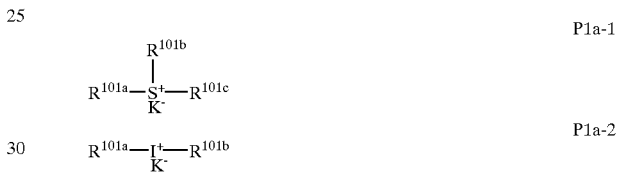

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by K⁻ include halide ions such as chloride and bromide ions, fluoroalkylsulfonate ions such as triflate, 1,1,1-trifluoroethanesulfonate, and nonafluorobutane-sulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

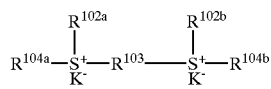

P1b

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1) and (P1a-2).

(ii) Diazomethane Derivatives of Formula (P2)

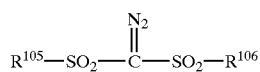

P2

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, O-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

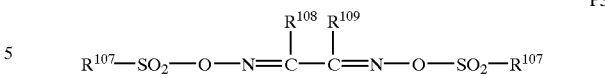

P3

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

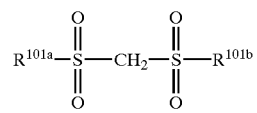

P4

Herein, $R^{101a}$ and $R^{101b}$ are as defined above.

(v) Sulfonic Acid Esters of N-hydroxyimide Compounds of Formula (P5)

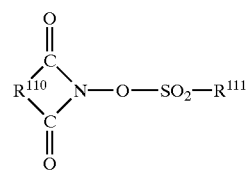

P5

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:

onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthyl-sulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)-sulfonium trifluoromethanesulfonate], and 1,2'-naphthylcarbonylmethyl-tetrahydrothiophenium triflate;

diazomethane derivatives such as bis(benzenesulfonyl) diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis(isobutylsulfonyl)diazomethane, bis(sec-butylsulfonyl) diazomethane, bis(n-propylsulfonyl)diazomethane, bis(isopropylsulfonyl)diazomethane, bis(tert-butylsulfonyl)diazomethane, bis(n-amylsulfonyl) diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl) diazomethane;

glyoxime derivatives such as bis-O-(p-toluene-sulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and Ibis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexyl-carbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris-(methanesulfonyloxy)benzene, 1,2,3-tris (trifluoromethanesulfonyloxy)benzene, and 1,2,3-tris (p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonyl-methyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl) diazomethane bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 15 parts, and especially 0.5 to 8 parts by weight, per 100 parts by weight of the base resin (all parts are by weight, hereinafter). Less than 0.1 part of the photoacid generator would provide a poor sensitivity whereas more than 15 parts of the photoacid generator would adversely affect transparency and resolution.

Organic Solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether and 1-ethoxy-2-propanol because the photoacid generator is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other Polymer

To the resist composition of the invention, another polymer other than the inventive polymer comprising recurring units of formula (1-1) or (1-2) may also be added. The other polymers that can be added to the resist composition are, for example, those polymers comprising units of the following formula (R1) and/or (R2) and having a weight average molecular weight of about 1,000 to about 500,000, especially about 5,000 to about 100,000 although the other polymers are not limited thereto.

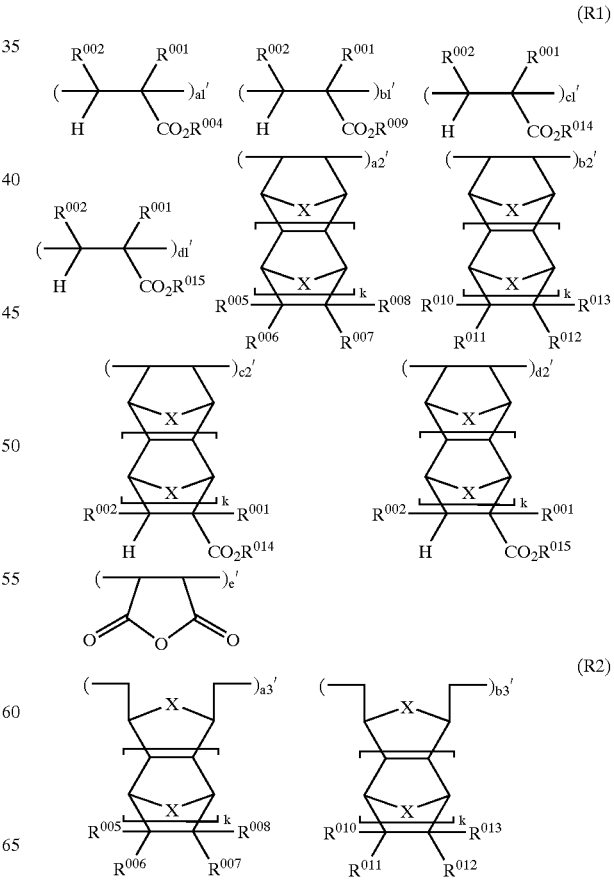

-continued

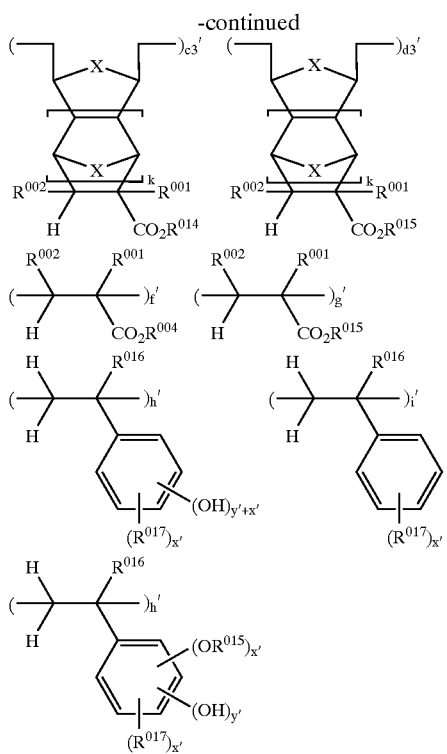

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 2 to 15 carbon atoms containing at least one partial structure selected from among ether, aldehyde, ketone, ester, carbonate, acid anhydride, amide and imide. At least one of $R^{010}$ to $R^{013}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. X is $CH_2$ or an oxygen atom. Letter k' is equal to 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' each are an integer of 0 to 3, satisfying $1 \leq x'+y'+z2 \leq 5$ and $1 \leq y'+z' \leq 3$.

Exemplary groups of these R's are as exemplified above.

The inventive polymer (comprising recurring units of formula (1-1) or (1-2)) and the other polymer are preferably blended in a weight ratio from 100:0 to 10:90, more preferably from 100:0 to 20:80. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution Regulator

To the resist composition, a dissolution regulator may be added. The dissolution regulator is a compound having on the molecule at least two phenolic hydroxyl groups, in which an average of from 0 to 100 molt of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 molt, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

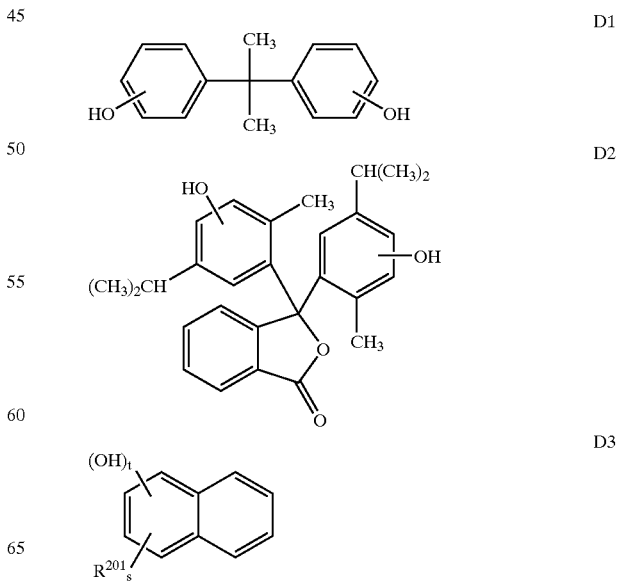

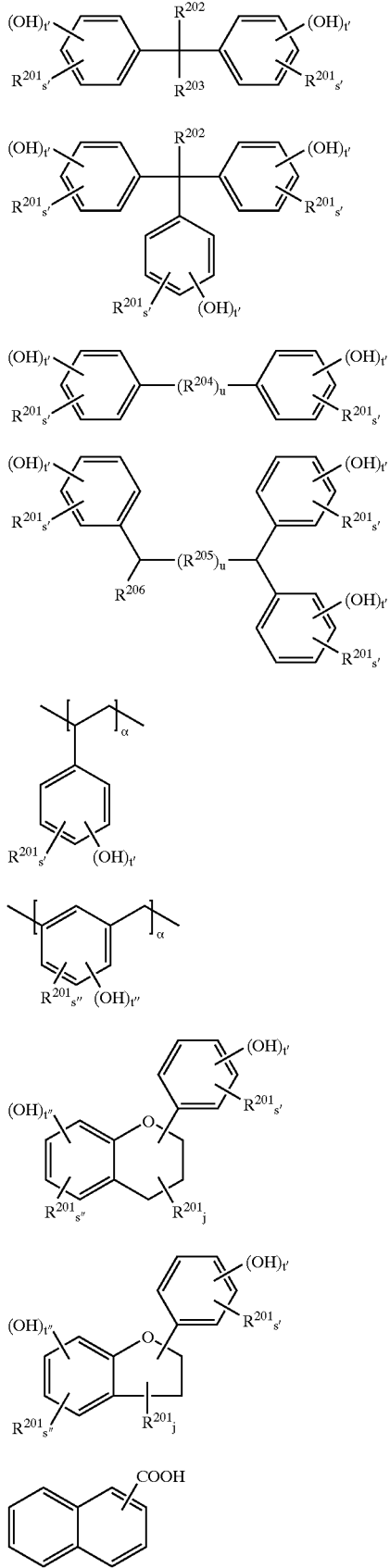

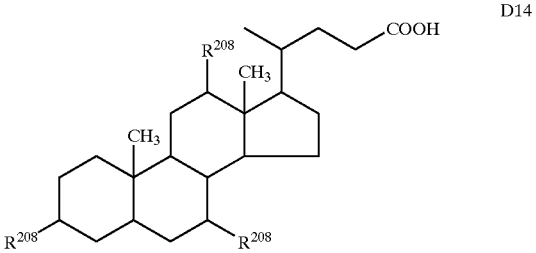

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or $-(R^{207})_h-$COOH; $R^{204}$ is $-(CH_2)_i-$ (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2$COOH; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms.

(L1)

(L2)

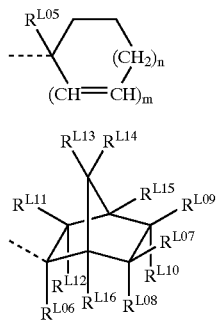

(L3)

(L4)

In these formulas, $R^{L01}$ and $R^{L02}$ are each hydrogen or a straight, branched or cyclic alkyl having 1 to 18 carbon atoms; and $R^{L03}$ is a monovalent hydrocarbon group of 1 to 18 carbon atoms which may contain a heteroatom (e.g., oxygen). A pair of $R^{L01}$ and $R^{L02}$, a pair of $R^{L01}$ and $R^{L03}$, or a pair of $R^{L02}$ and $R^{L03}$ may together form a ring, with the proviso that $R^{L01}$, $R^{L02}$, and $R^{L03}$ are each a straight or branched alkylene of 1 to 18 carbon atoms when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). $R^{L05}$ is a monovalent hydrocarbon group of 1 to 8 carbon atoms which may contain a hetero atom or a substituted or unsubstituted aryl group of 6 to 20 carbon atoms. $R^{L06}$ is a monovalent hydrocarbon group of 1 to 8 carbon atoms which may contain a hetero atom or a substituted or unsubstituted aryl group of 6 to 20 carbon atoms. $R^{L07}$ to $R^{L16}$ independently represent hydrogen or monovalent hydrocarbon groups of 1 to 15 carbon atoms which may contain a hetero atom. Alternatively, $R^{L07}$ to $R^{L16}$, taken together, may form a ring. Each of $R^{L07}$ to $R^{L16}$ represents a divalent $C_1$–$C_{15}$ hydrocarbon group which may contain a hetero atom, when they form a ring. Two of $R^{L07}$ to $R^{L16}$ which are attached to adjoining carbon atoms may bond together directly to form a double bond. Letter y is an integer of 0 to 6. Letter m is equal to 0 or 1, n is equal to 0, 1, 2 or 3, and 2m+n is equal to 2 or 3. Illustrative examples of these groups are as previously exemplified.

The dissolution regulator may be formulated in an amount of 0 to 50 parts, preferably 0 to 40 parts, and more preferably 0 to 30 parts, per 100 parts of the base resin, and may be used singly or as a mixture of two or more thereof. The use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic Compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylene-diamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl-methylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethylltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, truisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

$$N(X)_n(Y)_{3-n} \quad \text{B1}$$

In the formula, n is equal to 1, 2 or 3; Y is independently hydrogen or a straight, branched or cyclic alkyl group of 1 to 20 carbon atoms which may contain a hydroxyl group or ether; and X is independently selected from groups of the following general formulas (X1) to (X3), and two or three X's may bond together to form a ring.

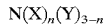 (X1)

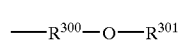 (X2)

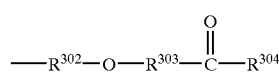 (X3)

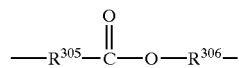

In the formulas, $R^{300}$, $R^{302}$ and $R^{305}$ are independently straight or branched alkylene groups of 1 to 4 carbon atoms; $R^{301}$, $R^{304}$ and $R^{306}$ are independently hydrogen, straight, branched or cyclic alkyl groups of 1 to 20 carbon atoms, which may contain at least one hydroxyl group, ether, ester or lactone ring; and $R^{303}$ is a single bond or a straight or branched alkylene group of 1 to 4 carbon atoms.

Illustrative examples of the compounds of formula (B1) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}-amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl) amine, tris(2-acetoxyethyl)amine, tris(2-propionyloxyethyl) amine, tris(2-butyryloxyethyl)amine, tris(2-isobutyryloxyethyl)amine, tris(2-valeryloxyethyl)amine, tris (2-pivaloyloxyethyl)amine, N,N-bis(2-acetoxy-ethyl)-2-(acetoxyacetoxy)ethylamine, tris(2-methoxycarbonyl-oxyethyl)amine, tris(2-tert-butoxycarbonyloxyethyl)amine, tris[2-(2-oxopropoxy)ethyl]amine, tris[2-(methoxycarbonyl-methyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl] ethylamine, N,N-bis(2-acetoxyethyl)-2-[(methoxycarbonyl) methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl] ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl) ethylamine, N,N-bis(2-methoxyethyl)-2-(methoxycarbonyl) ethylamine, N-(2-hydroxyethyl)-bis[2-(methoxycarbonyl) ethyl]amine, N-(2-acetoxyethyl)-bis[2-(methoxycarbonyl) ethyl]amine, N-(2-hydroxyethyl)-bis[2-(ethoxycarbonyl) ethyl]amine, N-(2-acetoxyethyl)-bis[2-(ethoxycarbonyl) ethyl]amine, N-(3-hydroxy-1-propyl)-bis[2-(methoxycarbonyl)ethyl]amine, N-(3-acetoxy-e-propyl)-bis [2-(methoxycarbonyl)ethyl]amine, N-(2-methoxyethyl)-bis [2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]-amine, tris(methoxycarbonyl-methyl)amine, tris(ethoxycarbonylmethyl)amine, N-butyl-bis(methoxycarbonylmethyl)amine, N-hexyl-bis (methoxycarbonylmethyl)amine, and β-(diethylamino)-δ-valerolactone.

Also useful are one or more of cyclic structure-bearing basic compounds having the following general formula (B2).

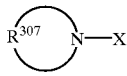

Herein X is as defined above, and $R^{307}$ is a straight or branched alkylene group of 2 to 20 carbon atoms which may contain one or more carbonyl groups, ether structures, ester structures or sulfide structures.

Illustrative examples of the cyclic structure-bearing basic compounds having formula (B2) include 1-[2-(methoxymethoxy)ethyl]pyrrolidine, 1-[2-(methoxymethoxy)ethyl]piperidine, 4-[2-(methoxymethoxy)ethyl]-morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]-morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, b-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B3) to (B6) may be blended.

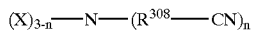

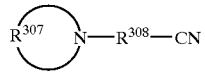

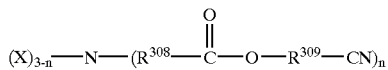

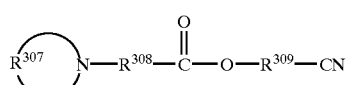

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B3) to (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylamino-acetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy) ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis (2-formyloxyethyl)-3-aminopropionate, 2-cyanoethyl N,N-bis (2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 10 parts, and especially 0.01 to 1 part, per part of the photoacid generator. Less than 0.001 part of the basic compound may fail to achieve the desired effects thereof, while the use of more than 10 parts would result in too low a sensitivity and resolution.

Other Components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{40}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

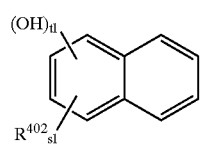

A1

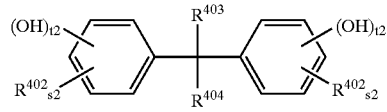

A2

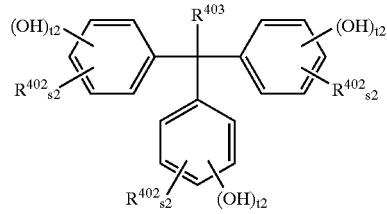

A3

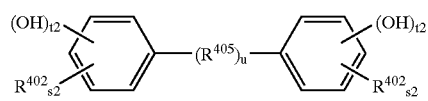

A4

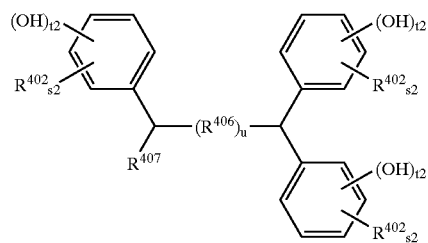

A5

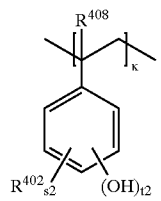

A6

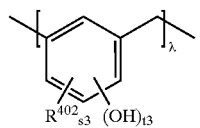

A7

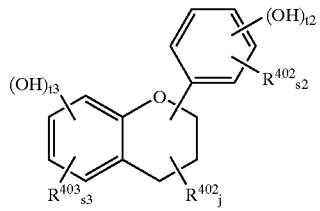

A8

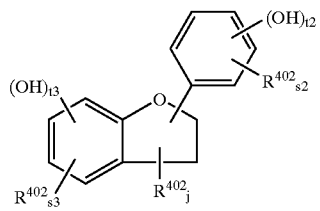

A9

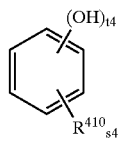

A10

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —$(R^{409})_h$—COOR' group (R' being hydrogen or —$R^{409}$—COOH); $R^{405}$ is —$(CH_2)_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkylene of 1 to 10 carbon atoms; $R^{410}$ is hydrogen, a straight or branched alkyl or alkenyl of 1 to 8 carbon atoms, or a —$R^{411}$—COOH group; $R^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

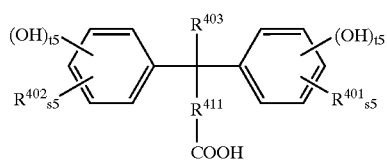

A11

A12
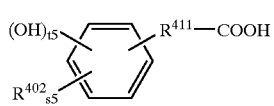
A13
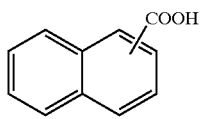
A14
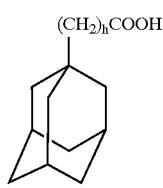
A15
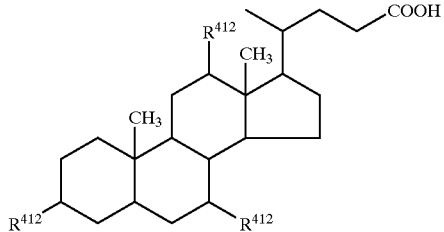
In these formulas, $R^{402}$, $R^{403}$, and $R^{411}$ are as defined above; $R^{412}$ is hydrogen or hydroxyl; s5 and t5 are numbers which satisfy $s5 \geq 0$, $t5 \geq 0$, and $s5+t5=5$; and h' is equal to 0 or 1.
Illustrative, non-limiting examples of the compound bearing a $\equiv$C—COOH group include compounds of the general formulas AI-1 to AI-14 and AII-1 to AII-10 below.
AI-1
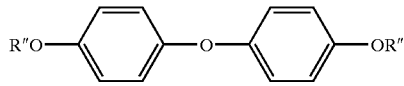
AI-2
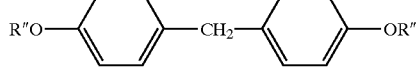
AI-3
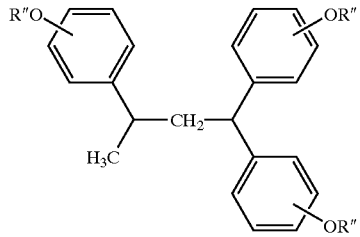
AI-4
AI-5
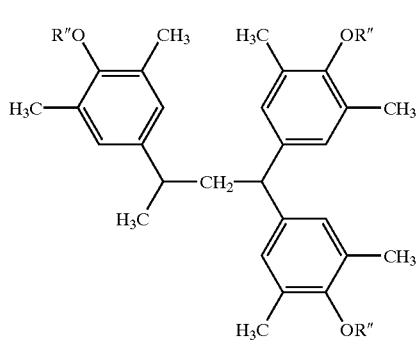
AI-6
AI-7
AI-8
AI-9
AI-10
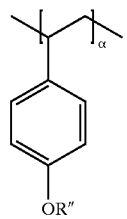
AI-11
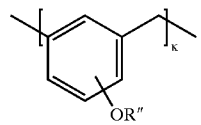
AI-12
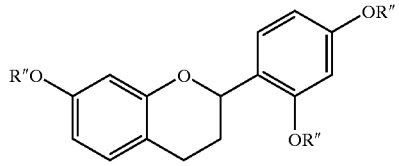
AI-13
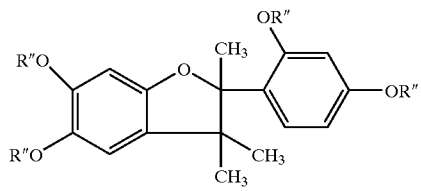
AI-14
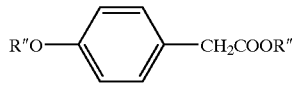

In the above formulas, R" is hydrogen or a CH₂COOH group such that the CH₂COOH group accounts for 10 to 100 mol % of R" in each compound, α and κ are as defined above.

AII-1
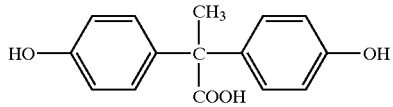

AII-2
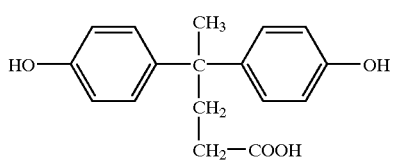

AII-3
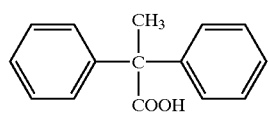

AII-4
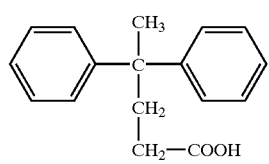

AII-5
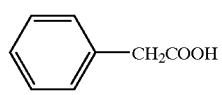

AII-6
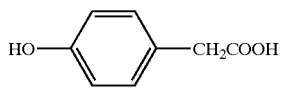

AII-7
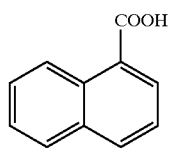

AII-8
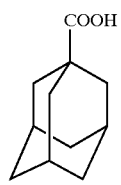

AII-9
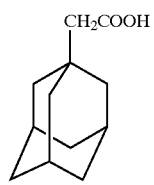

AII-10
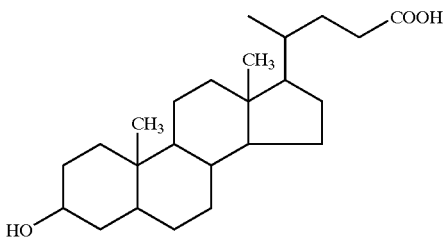

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

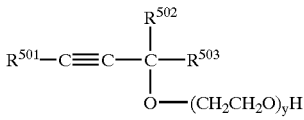

S1

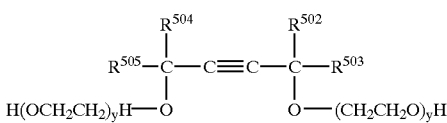

S2

In the formulas, $R^{501}$, $R^{502}$ $R^{503}$ $R^{504}$ and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics.

Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M, Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Florade FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.2 to 2.0 nm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UW rays, an excimer laser, or x-rays in a dose of about 1 to 200 mJ/cm$^2$, and preferably about 5 to 100 mJ/cm$^2$, then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

The resist composition comprising the inventive polymer as a base resin lends itself to micropatterning with electron beams or deep-UV rays since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed.

EXAMPLE

Synthesis Examples and Examples are given below by way of illustration and not by way of limitation. The abbreviation Mw is a weight average molecular weight as measured by GPC using a polystyrene standard, and SEM is scanning electron microscope.

Synthesis Example I

Polymers within the scope of the invention were synthesized by the following procedure.

Synthesis Example I-1

Synthesis of Polymer 1

A mixture of 16.6 g of 3,6-epoxy-2,2-dimethyl-2,2a,3,6,6a,7-hexahydrobenzo[c]furan (synthesized by monotosylating 3,6-epoxy-4-hydroxymethyl-5-(1-hydroxy-1-methylethyl)-1-cyclohexane, with simultaneous cyclization), 104.0 g of 2-ethyl-2-norbornyl 5-norbornene-2-carboxylate, 49.0 g of maleic anhydride, and 18.8 g of 1,4-dioxane was heated at 60° C. To the solution was added 7.4 g of 2,2'-azobis(2,4-dimethylvaleronitrile). The solution was stirred for 15 hours while keeping at 60° C. The reaction solution was cooled to room temperature and dissolved in 500 ml of acetone, which with vigorous stirring, was added dropwise to 10 liters of isopropyl alcohol. The resulting solids were collected by filtration and dried in vacuum at 40° C. for 15 hours, obtaining a polymer, designated Polymer 1, in white powder solid form. The amount was 79.8 g with a yield of 47.1%.

Synthesis Examples I-2 to I-8

Synthesis of Polymers 2-8

Polymers 2 to 8 were synthesized by the same procedure as above or a well-known procedure.

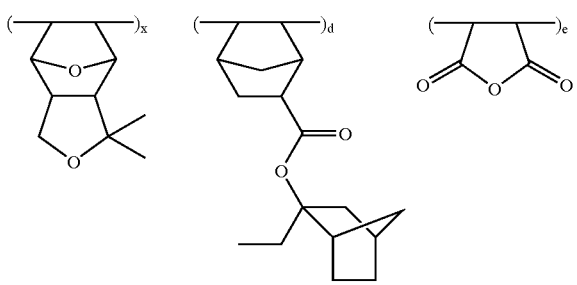

(Polymer 1)
(x = 0.10, d = 0.40, e = 0.50, Mw = 7,700)

-continued
(Polymer 2)
(x = 0.10, d = 0.40, e = 0.50, Mw = 8,100)
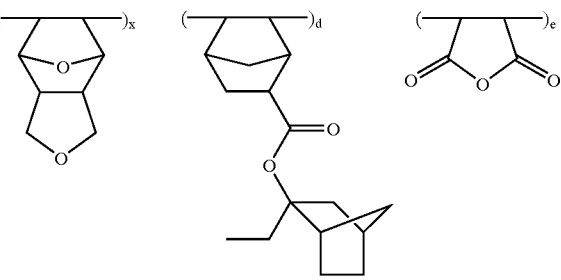
(Polymer 3)
(x = 0.10, d = 0.40, e = 0.50, Mw = 8,500)
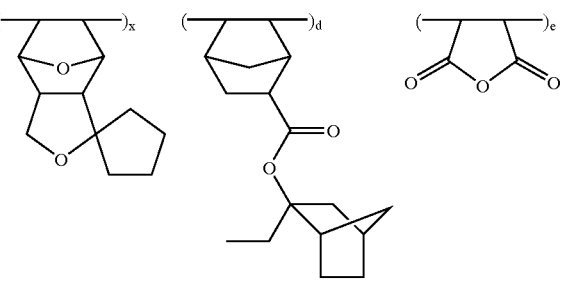
(Polymer 4)
(x = 0.10, d = 0.40, e = 0.50, Mw = 8,400)
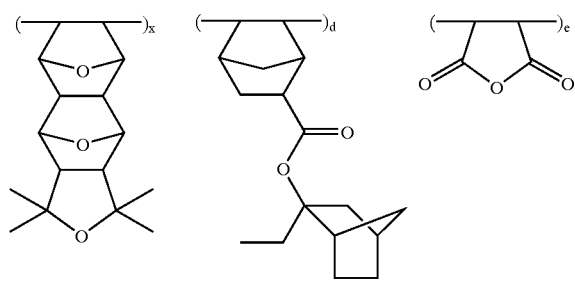
(Polymer 5)
(x = 0.10, d = 0.40, e = 0.50, Mw = 8,500)
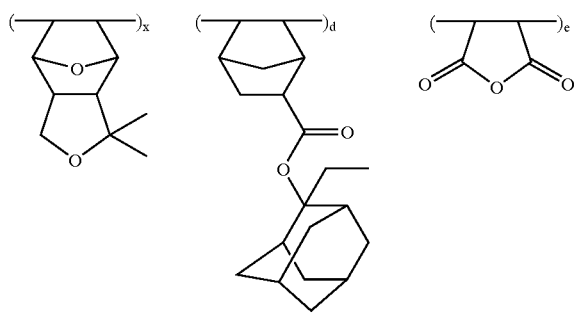
(Polymer 6)
(x = 0.40, d = 0.60, Mw = 17,200)
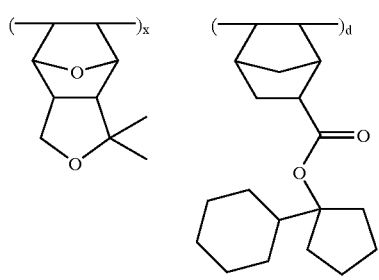

-continued (Polymer 7)
(x = 0.20, d = 0.60, e = 0.20,
Mw = 9,800

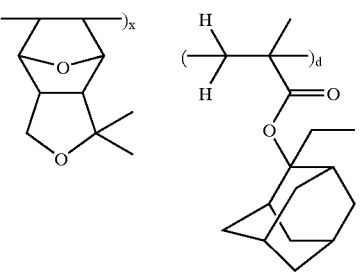

(Polymer 8)
(x = 0.50, d = 0.50,
Mw = 13,700)

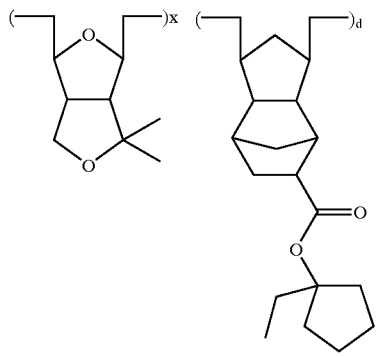

Synthesis Example II

Tetrahydrofuran compounds within the scope of the invention were synthesized by the following procedure.

Synthesis Example II-1

Synthesis of Monomer 1

In 200 ml of pyridine was dissolved 46.7 g of 3,6-epoxy-4-cyclohexene-1,2-dimethanol. In a nitrogen stream, the solution was cooled at 5° C., and 60.0 g of p-toluenesulfonyl chloride was added thereto. The solution was stirred at the temperature for one hour and then at room temperature for 8 hours. The reaction mixture was poured into dilute hydrochloric acid, followed by extraction with ethyl acetate. The ethyl acetate solution was washed with a saturated sodium chloride solution, dried over magnesium sulfate, and concentrated in vacuum, yielding crude 3,6-epoxy-2-(p-toluenesulfonyloxymethyl)-4-cyclohexene-1-methanol. The crude product was dissolved in 500 ml of tetrahydrofuran, which was added dropwise to a mixture of an aqueous 26% sodium hydroxide solution and 1 g of tetra-n-butylammonium chloride. The resulting mixture was agitated at room temperature for 12 hours. Thereafter, the tetrahydrofuran layer was separated, washed with water and saturated sodium chloride solution, dried over magnesium sulfate, concentrated in vacuum, and purified by silica gel column chromatography, obtaining 31 g (yield 75%) of the end compound, 3,6-epoxy-2,2a,3,6,6a,7-hexahydrobenzo[c]furan.

EI-mass spectrum (70 eV): (M/Z)$^+$=39, 51, 68, 77

CI-mass spectrum (isobutane): (M/Z)$^+$=109, 121, 139 [(M+H)$^+$]

Synthesis Example II-2

Synthesis (1) of Monomer 2

In 2000 ml of pyridine was dissolved 360 g of 3,6-epoxy-4-hydroxymethyl-5-(1-hydroxy-1-methylethyl)-1-cyclohexene. In a nitrogen stream, the solution was cooled at 5° C., and 400 g of p-toluenesulfonyl chloride was added thereto. The solution was stirred at the temperature for one hour and then at room temperature for 18 hours (at this stage, a corresponding monotosylate, i.e., 3,6-epoxy-4-(1-hydroxy-1-methylethyl)-5-(p-toluenesulfonyloxymethyl)-1-cyclohexene formed in the reaction system). The reaction mixture was then heated at 60° C., and stirred at the temperature for 4 hours (at this stage, pyridine served as the base to induce cyclization so that the end compound formed). After cooling, the reaction mixture was poured into a saturated sodium chloride solution, followed by extraction with ethyl acetate. The ethyl acetate solution was washed with dilute hydrochloric acid, water and an aqueous saturated potassium carbonate solution, dried over magnesium sulfate, and concentrated in vacuum. Vacuum distillation of the concentrate gave 308 g (yield 95%) of the end compound, 3,6-epoxy-2,2-dimethyl-2,2a,3,6,6a,7-hexahydrobenzo[c]furan.

Boiling point: 65° C./34 Pa

IR (thin film): ν=2856, 1379, 1363, 1209, 1132, 1036 cm$^{-1}$ $^1$H-NMR (300 MHz in CDCl$_3$): δ=1.18 (3H, s), 1.35 (3H, s), 2.01 (1H, d, J=7.2 Hz), 2.47 (1H, dt, J=3.3, 7.4 Hz), 3.73 (1H, dd, J=3.0, 9.4 Hz), 3.92 (1H, dd, J=7.4, 9.4 Hz), 4.75 (1H, d, J=0.8 Hz), 4.92 (1H, d, J=1.4 Hz), 6.34 (1H, dd, J=1.7, 5.8 Hz), 6.37 (1H, dd, J=1.4, 5.8 Hz)

Synthesis Example II-3

Synthesis (2) of Monomer 2

In 1000 ml of carbon tetrachloride were dissolved 160 g of 3,6-epoxy-4-hydroxymethyl-5-(1-hydroxy-1-methylethyl)-1-cyclohexene and 230 g of triphenylphos phine. With stirring, the mixture was heated to reflux for 28 hours. After cooling, 1000 ml of n-hexane was added to the reaction solution whereupon the triphenylphosphine oxide formed was filtered off. The filtrate was concentrated in vacuum and distilled in vacuum, obtaining 108 g (yield 75%) of the end compound. The physical properties and spectra of this compound matched with those of Synthesis Example II-2.

Synthesis Example II-4

Synthesis of Monomer 3

Reaction was carried out as in Synthesis Example II-2 except that 3,6-epoxy-4-hydroxymethyl-5-(1-hydroxy-1-cyclopentyl)-1-cyclohexene was used instead of the 3,6-epoxy-4-hydroxymethyl-5-(1-hydroxy-1-methylethyl)-1-cyclohexene in Synthesis Example II-2. The end compound, 3,6-epoxy-2,2-tetramethylene-2,2a,3,6,6a,7-hexahydrobenzo-[c]furan was obtained in a yield of 92%.

Boiling point: 97–100° C./44 Pa

IR (potassium bromide disk): ν=2958, 2870, 1340, 1325, 1214, 1176, 1032 cm$^{-1}$ $^{1}$H-NMR (300 MHz in CDCl$_3$): δ=1.30–1.95 (8H, m), 2.13 (1H, d, J=7.2 Hz), 2.42 (1H, dt, J=3.0, 7.4 Hz), 3.71 (1H, dd, J=3.3, 9.6 Hz), 3.83 (1H, dd, J=7.4, 9.6 Hz), 4.77 (1H, s), 4.89 (1H, s), 6.33–6.39 (2H, m)

Monomer 1

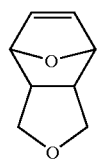

Monomer 2

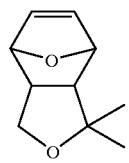

Monomer 3

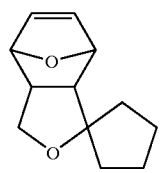

Example I

Resist compositions were formulated using the inventive polymers as a base resin and examined for swell-suppressing effect.

Examples I-1 to I-4 & Comparative Examples 1, 2

Resist compositions were prepared by blending the inventive polymers (Polymers 1 to 4) and comparative polymers (Polymers 9 and 10 shown below) as a base resin, a photoacid generator (PAG1), a basic compound and a solvent in accordance with the formulation shown in Table 1. They were passed through a Teflon filter having a pore diameter of 0.2 μm, obtaining resist solutions.

(Polymer 9)
(d = 0.50, e = 0.50,
Mw = 7,700)

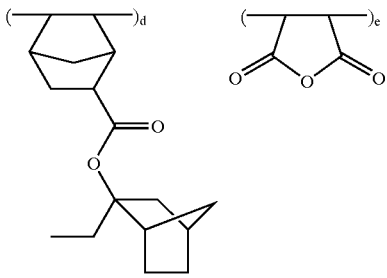

(Polymer 10)
(a = 0.10, d = 0.40, e = 0.50,
Mw = 7,900)

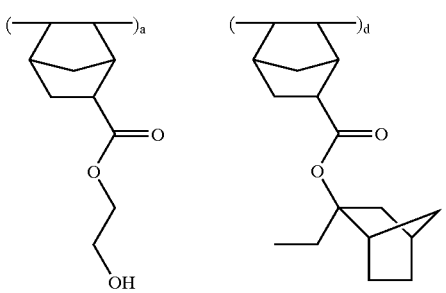

-continued

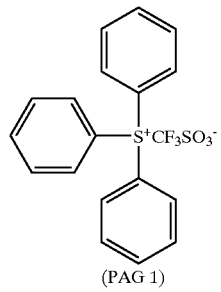

(PAG 1)

Each resist solution was spin coated on a silicon wafer having hexamethyldisilazane sprayed thereon at 90° C. for 90 seconds and heat treated at 110° C. for 90 seconds, forming a resist film of 0.5 μm thick. Using a KrF excimer laser stepper (Nikon Corp., NA=0.5), the resist film was exposed to light in total eleven spots at different exposures including five points spaced apart from a previously measured sensitivity (Eth, mJ/CM$^2$) at a pitch of 5% in each of descending and ascending directions. Thereafter, the resist film was heat treated at 110° C. for 90 seconds, at which point of time the thickness of the film at different exposure spots was measured. It is a film thickness (Å) before development. The coated silicon wafer was immersed in a 2.38% tetramethylammonium hydroxide aqueous solution for 200 seconds for development, at which point of time the thickness of the film at different exposure spots was measured. It is a film thickness (Å) after development. For each of the different exposure spots, the film thicknesses before and after development were compared. The spot where a film thickness increase after development was observed was regarded as having been swollen, with the maximum of thickness increase being reported as a swell (Å).

The formulation and test results of the resist compositions are shown in Table 1. Note that the basic compound and solvent used are tributylamine (TBA) and propylene glycol methyl ether acetate (PGMEA), respectively. The solvent contained 0.01% by weight of surfactant KH-20 (Asahi Glass Co., Ltd.).

TABLE 1

|  | Resin (pbw) | Photoacid generator (pbw) | Basic compound (pbw) | Solvent (pbw) | Swell (Å) |
|---|---|---|---|---|---|
| Example |  |  |  |  |  |
| I-1 | Polymer 1 (80) | PAG 1 (1) | TBA (0.078) | PGMEA (480) | −33 |
| I-2 | Polymer 2 (80) | PAG 1 (1) | TBA (0.078) | PGMEA (480) | −52 |
| I-3 | Polymer 3 (80) | PAG 1 (1) | TBA (0.078) | PGMEA (480) | −20 |
| I-4 | Polymer 4 (80) | PAG 1 (1) | TBA (0.078) | PGMEA (480) | −61 |
| Comparative Example |  |  |  |  |  |
| 1 | Polymer 9 (80) | PAG 1 (1) | TBA (0.078) | PGMEA (480) | 181 |
| 2 | Polymer 10 (80) | PAG 1 (1) | TBA (0.078) | PGMEA (480) | 89 |

It is evident from Table 1 that the inventive polymers are highly effective for suppressing swell.

Example II

Resist compositions were formulated using inventive polymers and examined for resolution upon KrF excimer laser exposure.

Examples II-1 to II-17

Evaluation of Resist Resolution

Resist compositions were prepared by using Polymers 1 to 8 as the base resin, and dissolving the polymer, a photoacid generator (designated as PAG1 and 2), a dissolution regulator (designated as DRR1 to 4), a basic compound, and a compound having a ≡C—COOH group in the molecule (ACC1 and 2) in a solvent in accordance with the formulation shown in Table 2. These compositions were each filtered through a Teflon filter (pore diameter 0.2 μm), thereby giving resist solutions.

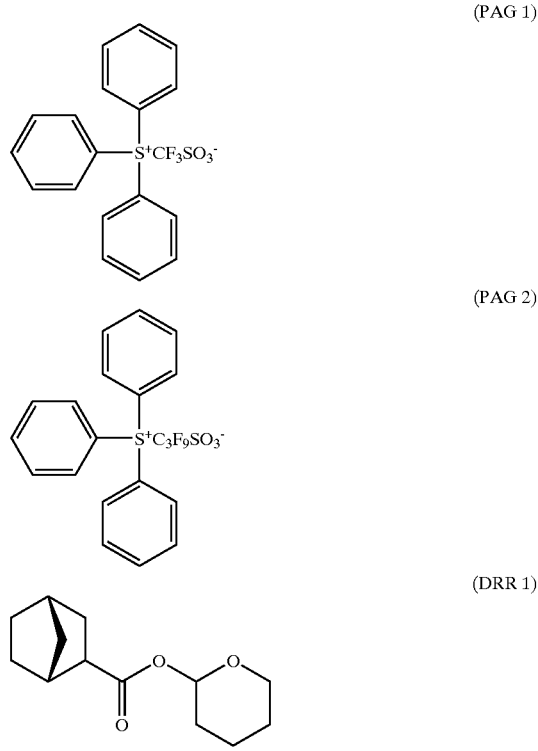

-continued (DRR 2)

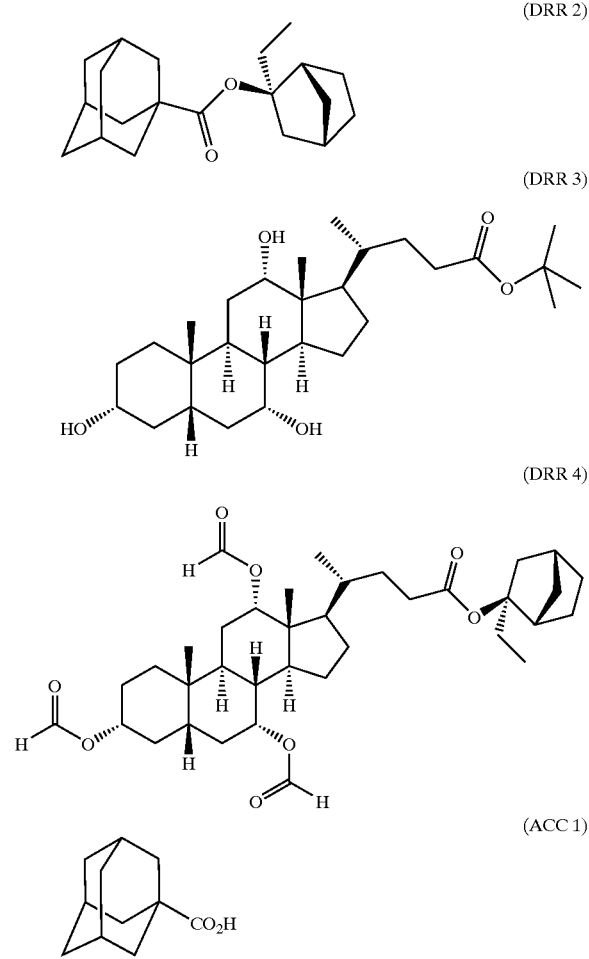

(DRR 3)

(DRR 4)

(ACC 1)

-continued (ACC 2)

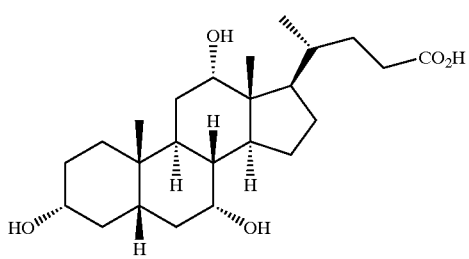

These resist solutions were spin coated onto silicon wafers having hexamethyldisilazane spray coated thereon at 90° C. for 90 seconds, then heat treated at 110° C. for 90 seconds to give resist films having a thickness of 0.5 μm. The resist films were exposed using an KrF excimer laser stepper (Nikon Corporation; NA 0.5), then heat treated at 110° C. for 90 seconds, and puddle developed with a solution of 2.38% tetramethylammonium hydroxide in water for 60 seconds, thereby giving 1:1 line-and-space patterns.

The wafers as developed were sectioned and observed under sectional SEM. The optimal exposure (Eop, mJ/cm$^2$) was defined as the exposure which provided a 1:1 resolution at the top and bottom of a 0.30 μm line-and-space pattern. The resolution of the resist under evaluation was defined as the minimum line width (μm) of the lines and spaces that separated at the optimal exposure. The shape of the resolved resist pattern was examined under a SEM and classified into rectangular, rounded head, T-top, forward taper or reverse taper.

The composition and test results of the resist materials are shown in Table 2. The solvent and basic compounds used are as follows. It is noted that the solvent contained 0.01% by weight of surfactant KH-20 (Asahi Glass Co., Ltd.).
PGMEA: propylene glycol methyl ether acetate
TEA: triethanolamine
TMMEA: trismethoxymethoxyethylamine
TMEMEA: trismethoxyethoxymethoxyethylamine

TABLE 2

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| II-1 | Polymer 1 (80) | PAG 1 (1) | — | TEA (0.063) | PGMEA (480) | 24.0 | 0.20 | rectangular |
| II-2 | Polymer 2 (80) | PAG 1 (1) | — | TEA (0.063) | PGMEA (480) | 23.0 | 0.20 | rectangular |
| II-3 | Polymer 3 (80) | PAG 1 (1) | — | TEA (0.063) | PGMEA (480) | 22.0 | 0.22 | rectangular |
| II-4 | Polymer 4 (80) | PAG 1 (1) | — | TEA (0.063) | PGMEA (480) | 25.0 | 0.22 | rectangular |
| II-5 | Polymer 5 (80) | PAG 1 (1) | — | TEA (0.063) | PGMEA (480) | 28.0 | 0.20 | rectangular |
| II-6 | Polymer 6 (80) | PAG 1 (1) | — | TEA (0.063) | PGMEA (480) | 20.0 | 0.20 | rectangular |
| II-7 | Polymer 7 (80) | PAG 1 (1) | — | TEA (0.063) | PGMEA (480) | 29.0 | 0.20 | rectangular |
| II-8 | Polymer 8 (80) | PAG 1 (1) | — | TEA (0.063) | PGMEA (480) | 21.0 | 0.22 | rectangular |
| II-9 | Polymer 5 (80) | PAG 2 (1) | — | TEA (0.063) | PGMEA (480) | 29.0 | 0.20 | rectangular |
| II-10 | Polymer 5 (80) | PAG 2 (1) | — | TMMEA (0.118) | PGMEA (480) | 28.0 | 0.20 | rectangular |
| II-11 | Polymer 5 (80) | PAG 2 (1) | — | TMEMEA (0.173) | PGMEA (480) | 29.0 | 0.22 | rectangular |
| II-12 | Polymer 5 (70) | PAG 2 (1) | DRR 1 (10) | TEA (0.063) | PGMEA (480) | 24.0 | 0.22 | somewhat rounded head |

TABLE 2-continued

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| II-13 | Polymer 5 (70) | PAG 2 (1) | DRR 2 (10) | TEA (0.063) | PGMEA (480) | 25.0 | 0.20 | rectangular |
| II-14 | Polymer 5 (70) | PAG 2 (1) | DRR 3 (10) | TEA (0.063) | PGMEA (480) | 29.0 | 0.22 | rectangular |
| II-15 | Polymer 5 (70) | PAG 2 (1) | DRR 4 (10) | TEA (0.063) | PGMEA (480) | 26.0 | 0.20 | rectangular |
| II-16 | Polymer 5 (80) | PAG 2 (1) | ACC 1 (4) | TEA (0.063) | PGMEA (480) | 26.0 | 0.22 | somewhat rounded head |
| II-17 | Polymer 5 (80) | PAG 2 (1) | ACC 2 (4) | TEA (0.063) | PGMEA (480) | 29.0 | 0.22 | rectangular |

It is seen from Table 2 that the resist compositions within the scope of the invention have a high sensitivity and resolution upon KrF excimer laser exposure.

Example III

Resist compositions were formulated using inventive polymers and examined for resolution upon ArF excimer laser exposure.

Examples III-1 to III-2

Evaluation of Resist Resolution

Resist compositions were similarly prepared in accordance with the formulation shown in Table 3.

These resist solutions were spin coated onto silicon wafers having hexamethyldisilazane spray coated thereon at 90° C. for 90 seconds, then heat treated at 110° C. for 90 seconds to give resist films having a thickness of 0.5 μm. The resist films were exposed using an ArF excimer laser stepper (Nikon Corporation; NA 0.55), then heat treated at 110° C. for 90 seconds, and puddle developed with a solution of 2.38% tetramethylammonium hydroxide in water for 60 seconds, thereby giving 1:1 line-and-space patterns.

The wafers as developed were sectioned and observed under sectional SEM. The optimal exposure (Eop, mJ/cm$^2$) was defined as the exposure which provided a 1:1 resolution at the top and bottom of a 0.25 μm line-and-space pattern. The resolution of the resist under evaluation was defined as the minimum line width (μm) of the lines and spaces that separated at the optimal exposure. The shape of the resolved resist pattern was examined under a SEM and classified into rectangular, rounded head, T-top, forward taper or reverse taper. All the patterns were rectangular.

The composition and test results of the resist materials are shown in Table 3. The solvent and basic compounds used are as follows. It is noted that the solvent contained 0.01% by weight of surfactant KH-20 (Asahi Glass Co., Ltd.).

PGMEA: propylene glycol methyl ether acetate
TEA: triethanolamine
TMMEA: trismethoxymethoxyethylamine

TABLE 3

| Example | Resin (pbw) | Photoacid generator (pbw) | Dissolution regulator (pbw) | Basic compound (pbw) | Solvent (pbw) | Eop, mJ/cm$^2$ | Resolution, μm | Shape |
|---|---|---|---|---|---|---|---|---|
| III-1 | Polymer 5 (80) | PAG 1 (1) | — | TEA (0.063) | PGMEA (480) | 18.0 | 0.15 | rectangular |
| III-2 | Polymer 5 (80) | PAG 2 (1) | — | TMMEA (0.118) | PGMEA (480) | 19.0 | 0.15 | rectangular |

It is seen from Table 3 that the resist compositions within the scope of the invention have a high sensitivity and resolution upon ArF excimer laser exposure.

Japanese Patent Application Nos. 2001-124126 and 2001-124137 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer comprising recurring units of the following general formula (1-1) or (1-2) and having a weight average molecular weight of 1,000 to 500,000,

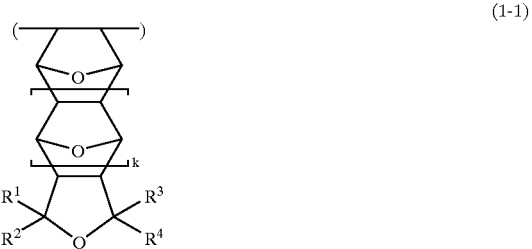

(1-1)

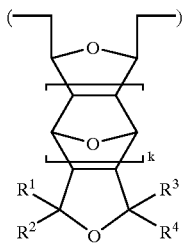

(1-2)

wherein each of $R^1$, $R^2$, $R^3$ and $R^4$ is hydrogen or a straight, branched or cyclic alkyl group of 1 to 15 carbon atoms, or a pair of $R^1$ and $R^2$ and a pair of $R^3$ and $R^4$ taken together may form a ring wherein each said pair is a straight, branched or cyclic alkylene group of 2 to 15 carbon atoms and k is equal to 0 or 1.

2. The polymer of claim 1 comprising, in addition to the recurring units of formula (1-1), recurring units of the following general formula (4) alone or in combination with recurring units of the following general formula (2-1), and recurring units of the following general formula (3):

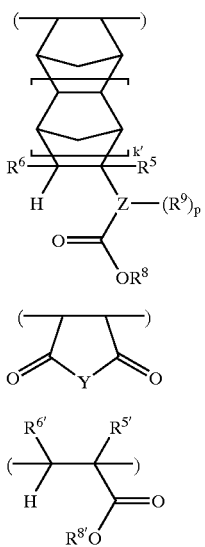

(2-1)

(3)

(4)

wherein
  $R^5$ is hydrogen, methyl or $CH_2CO_2R^7$,
  $R^6$ is hydrogen, methyl or $CO_2R^7$,
  $R^7$ which may be identical or different in $R^5$ and $R^6$ is straight, branched or cyclic alkyl group of 1 to 15 carbon atoms,
  $R^8$ is an acid liabile group,
  $R^9$ is selected from the class consisting of a halogen atoms, hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some of all of the hydrogen atoms on constituent carbon atoms may be substituted with halogen atoms,
  Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone,
  k' is 0 or 1,
  p is 0, 1 or 2,
  Y is —O— or —(NR$^{10}$)—,
  $R^{10}$ is hydrogen or a straight, branched or cyclic alkyl group of 1 to 15 carbon atoms
  $R^{5'}$ is hydrogen, methyl or $CH_2CO_2R^{7'}$,
  $R^{6'}$ is hydrogen, methyl or $CO_2R^{7'}$,
  $R^{7'}$ which may be identical or different in $R^{5'}$ and $R^{6'}$ is a straight, branched or cyclic alkyl group of 1 to 15 carbon atoms, and
  $R^{8'}$ is an acid labile group.

3. A polymer according to claim 2, wherein $R^5$ is hydrogen, methyl or $CH_2CO_2R^7$, $R^{5'}$ is hydrogen, methyl or $CH_2CO_2R^{7'}$, $R^6$ is hydrogen, methyl or $CO_2R^7$, $R^{6'}$ is hydrogen, methyl or $CO_2R^{7'}$, $R^7$ and $R^{7'}$ are in each case independently methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl or butyladamantyl, $R^8$ and $R^{8'}$ are in each case independently an acid labile group, $R^9$ is fluoro, chloro, bromo, hydroxyl, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, etbylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichloroacetoxy, 2,2,2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy, or tert-butoxycarbonyloxy, Y is —O— or —(NR$^{10}$)—, and $R^{10}$ is hydrogen, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl or butyladamantyl.

4. The polymer of claim 1 comprising, in addition to the recurring units of formula (1-2), recurring units of the following general formula (2-2):

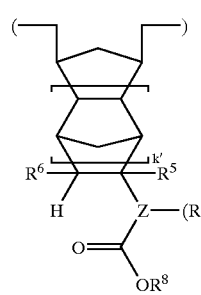

(2-2)

wherein
  $R^5$ is hydrogen, methyl or $CH_2CO_2R^7$,
  $R^6$ is hydrogen, methyl or $CO_2R^7$,
  $R^7$ which may be identical or different in $R^5$ and $R^6$ is straight, branched or cyclic alkyl group of 1 to 15 carbon atoms,
  $R^8$ is an acid labile group, R⁹ is selected from the class consisting of a halogen atoms, hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some of all of the hydrogen atoms on constituent carbon atoms may be substituted with halogen atoms, Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone, k' is 0 or 1, and p is 0, 1 or 2.

5. A resist composition comprising the polymer of claim 1.

6. A process for forming a resist pattern comprising the steps of: applying the resist composition of claim 5 onto a substrate to form a coating, heat treating the coating and then exposing it to high-energy radiation or electron beams through a photo mask, and optionally heat treating the exposed coating and developing it with a developer.

7. A polymer according to claim 1, wherein each of R¹, R², R³ and R⁴ are independently hydrogen methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, or butyladamantyl, or a pair of R¹ and R² or a pair of R³ and R⁴ taken together form a ring in which the combination of R¹ with R² or the combination of R³ with R⁴ are each independently ethylene, trimethylene, tetramethylene or pentamethylene.

8. A polymer according to claim 1, wherein recurring units of formula (1-1) are selected from the following formula:

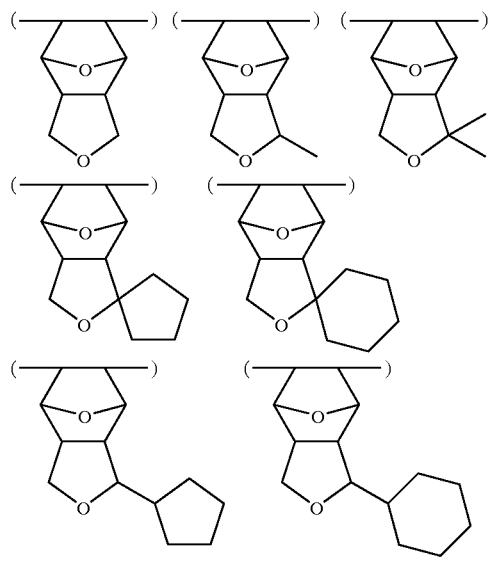

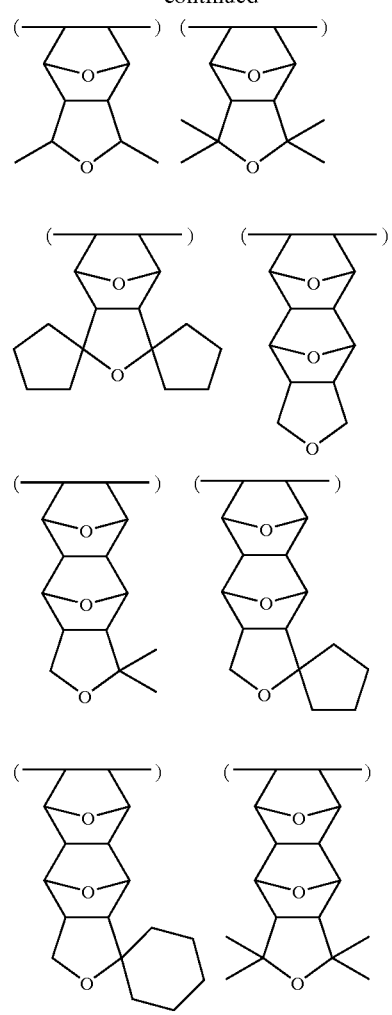

9. A polymer according to claim 1, wherein recurring units of formula (1-2) are selected from the following formula:

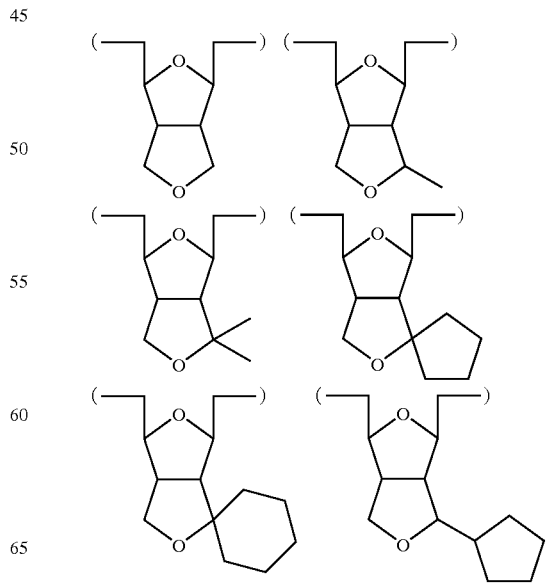

-continued

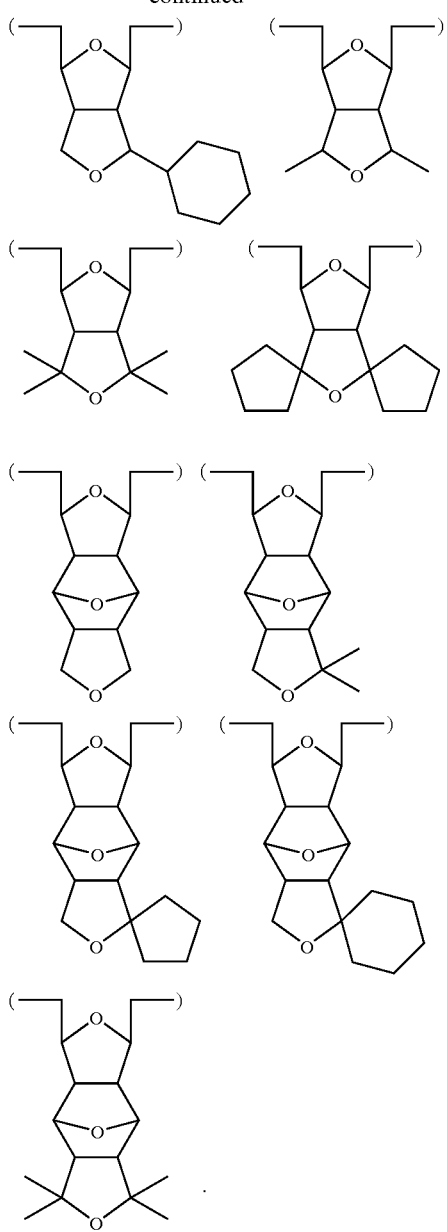

10. A process for forming a resist pattern comprising the steps of:

applying the resist composition of claim 9 onto a substrate to form a coating, heat treating the coating and then exposing it to high-energy radiation or electron beams through a photo mask, and optionally heat treating the exposed coating and developing it with a developer.

11. A chemically amplified positive resist composition comprising a polymer of claim 1, a photoacid generator, and an organic solvent.

12. The polymer of claim 1 comprising, in addition to the recurring units of formula (1-1), recurring units of the following general formula (2-1):

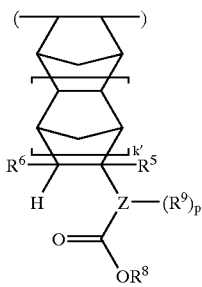

(2-1)

wherein $R^5$ is hydrogen, methyl or $CH_2CO_2R^7$, $R^6$ is hydrogen, methyl or $CO_2R^7$, $R^7$ which may be identical or different in $R^5$ and $R^6$ is a straight, branched or cyclic alkyl group of 1 to 15 carbon atoms, $R^8$ is an acid labile group, $R^9$ is selected from the class consisting of a halogen atom, a hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some or all of the hydrogen atoms on constituent carbon atoms may be substituted with halogen atoms, Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone, k' is 0 or 1, and p is 0, 1 or 2.

13. A polymer according to claim 12, wherein $R^5$ is hydrogen, methyl or $CH_2CO_2R^7$, $R^6$ is hydrogen, methyl or $CO_2R^7$, $R^7$ is in each case independently methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl or butyladamantyl, $R^8$ is an acid labile group, and $R^9$ is fluoro, chloro, bromo, hydroxyl, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, ethylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichloroacetoxy, 2,2,2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy, or tert-butoxycarbonyloxy.

14. A polymer according to claim 13, wherein $R^8$ is selected from the groups of following general formulae (L1) to (L4), tertiary alkyl groups of 4 to 20 carbon atoms, trialkylsilyl groups in which each alkyl moiety has 1 to 6 carbon atoms, and oxoalkyl groups of 4 to 20 carbon atoms

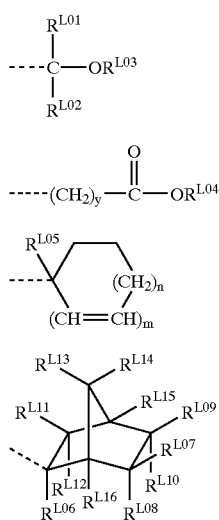

(L1)

(L2)

(L3)

(L4)

wherein

R$^{L01}$ and R$^{L02}$ are each independently hydrogen or straight, branched or cyclic alkyl groups of 1 to 18 carbon atoms, R$^{L03}$ is a monovalent hydrocarbon group of 1 to 18 carbon atoms, which optionally contains a hetero atom, in which some hydrogen atoms are replaced by hydroxyl, alkoxy, oxo, amino, alkylamino or the like, also a pair of R$^{L01}$ and R$^{L02}$, R$^{L01}$ and R$^{L03}$, or R$^{L02}$ and R$^{L03}$ can alternatively form a ring, in which case each of R$^{L01}$, R$^{L02}$ and R$^{L03}$ is a straight or branched alkylene group of 1 to 18 carbon atoms, R$^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1), Letter y is an integer of 0 to 6, R$^{L05}$ is a monovalent hydrocarbon group of 1 to 8 carbon atoms which may contain a hetero atom or a substituted or unsubstituted aryl group of 6 to 20 carbon atoms, Letter m is equal to 0 or 1, n is equal to 0, 1, 2 or 3, and 2m+n is equal to 2 or 3, L$^{L06}$ is a monovalent hydrocarbon group of 1 to 8 carbon atoms which may contain a hetero atom or a substituted or unsubstituted aryl group of 6 to 20 carbon atoms, R$^{L07}$ to R$^{L16}$ independently represent hydrogen or monovalent hydrocarbon groups of 1 to 15 carbon atoms which optionally contains a hetero atom, and alternatively, R$^{L107}$ to R$^{L16}$, taken together, form a ring, wherein each of R$^{L07}$ to R$^{L16}$ represents a divalent C$_1$–C$_{15}$ hydrocarbon group which may contain a hetero atom, and two of R$^{L07}$ to R$^{L16}$ which are attached to adjoining carbon atoms optionally bond together directly to form a double bond.

15. A polymer according to claim 12, wherein p is 0 and Z is methylene, ethylene, trimethylene, tetramethylene, pentamethylene, hexamethylene, 1,2-propanediyl, 1,3-butanediyl, 1-oxo-2-oxapropane-1,3-diyl, or 3-methyl-1-oxo-2-oxabutane-1,4-diyl.

16. A polymer according to claim 12, wherein recurring units of formula (2-1) are selected from the following formula:

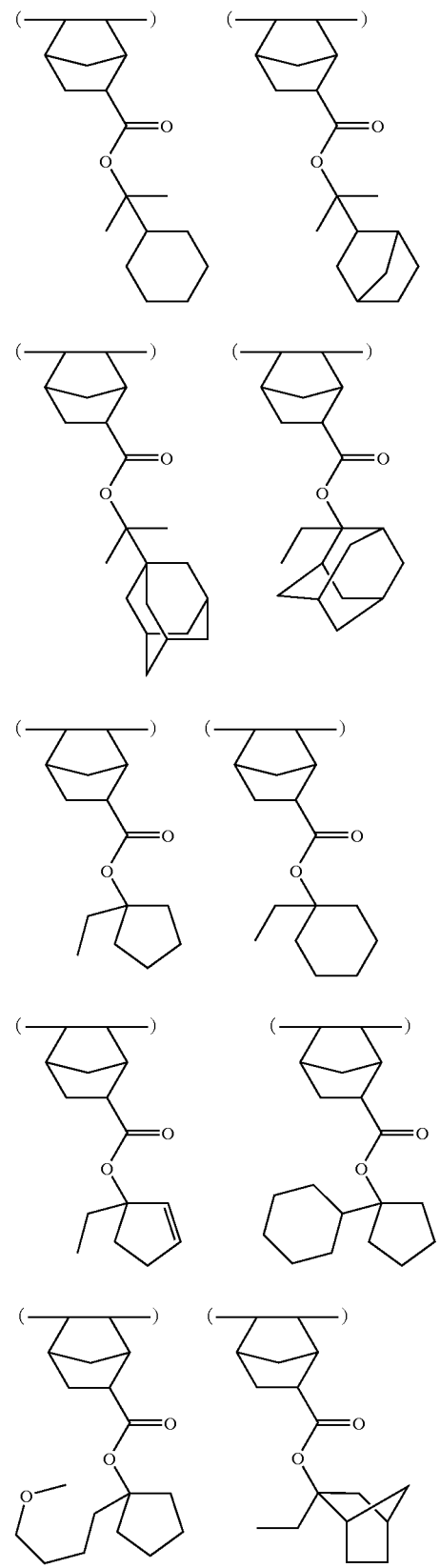

-continued

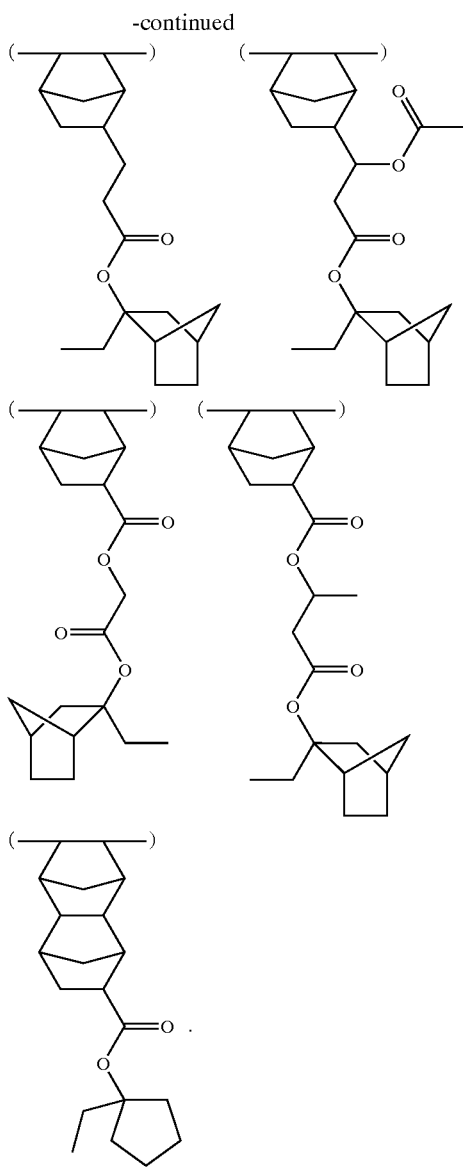

17. The polymer of claim 1 comprising, in addition to the recurring units of formula (1-1), recurring units of the following general formulae (2-1) and (3):

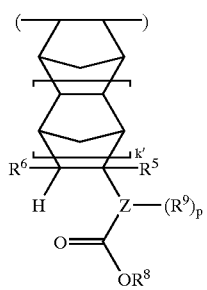
(2-1)

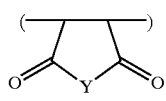
(3)

wherein
$R^5$ is hydrogen, methyl or $CH_2CO_2R^7$,
$R^6$ is hydrogen, methyl or $CO_2R^7$,
$R^7$ which may be identical or different in $R^5$ and $R^6$ is straight, branched or cyclic alkyl group of 1 to 15 carbon atoms,
$R^8$ is an acid labile group,
$R^9$ is selected from the class consisting of a halogen atoms, hydroxyl group, a straight, branched or cyclic alkoxy, acyloxy or alkylsulfonyloxy group of 1 to 15 carbon atoms, and a straight, branched or cyclic alkoxycarbonyloxy or alkoxyalkoxy group of 2 to 15 carbon atoms, in which some of all of the hydrogen atoms on constituent carbon atoms may be substituted with halogen atoms,
Z is a single bond or a straight, branched or cyclic (p+2)-valent hydrocarbon group of 1 to 5 carbon atoms, in which at least one methylene may be substituted with oxygen to form a chain-like or cyclic ether or two hydrogen atoms on a common carbon may be substituted with oxygen to form a ketone,
k' is 0 or 1, and
p is 0, 1 or 2,
Y is —O— or —(NR$^{10}$)—, and
$R^{10}$ is hydrogen or a straight, branched or cyclic alkyl group of 1 to 15 carbon atoms.

18. A polymer according to claim 17, wherein $R^5$ is hydrogen, methyl or $CH_2CO_2R^7$, $R^6$ is hydrogen, methyl or $CO_2R^7$, $R^7$ in each case independently methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyolohexyl, butylcyclohexyl, adamantyl, ethyladamantyl or butyladamantyl, $R^8$ is an acid labile group, $R^9$ is fluoro, chloro, bromo, hydroxyl, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, ethylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichioroacetoxy, 2,2,2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy, or tert-butoxycarbonyloxy, Y is —O— or —(NR$^{10}$)—, and $R^{10}$ is hydrogen, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl or butyladamantyl.

19. A polymer according to claim 18, wherein $R^8$ is selected from the groups of the following general formulae (L1) to (L4), tertiary ailcyl groups of 4 to 20 carbon atoms, trialkylsilyl groups in which each alkyl moiety has 1 to 6 carbon atoms, and oxoalkyl groups of 4 to 20 carbon atoms

(L1)

-continued

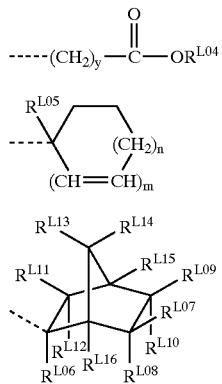

wherein
- $R^{L01}$ and $R^{L02}$ are each independently hydrogen or straight, branched or cyclic alkyl groups of 1 to 18 carbon atoms,
- $R^{L03}$ is a monovalent hydrocarbon group of 1 to 18 carbon atoms, which optionally contains a hetero atom, in which some hydrogen atoms are replaced by hydroxyl, alkoxy, oxo, amino, alkylamino or the like,
- also a pair of $R^{L01}$ and $R^{L02}$, $R^{L01}$ and $R^{L03}$, or $R^{L02}$ and $R^{L03}$ can alternatively form a ring, in which case each of $R^{L01}$, $R^{L02}$ and $R^{L03}$ is a straight or branched alkylene group of 1 to 18 carbon atoms,
- $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1),
- Letter y is an integer of 0 to 6,
- $R^{L05}$ is a monovalent hydrocarbon group of 1 to 8 carbon atoms which may contain a hetero atom or a substituted or unsubstituted aryl group of 6 to 20 carbon atoms,
- Letter m is equal to 0 or 1, n is equal to 0, 1, 2 or 3, and 2m+n is equal to 2 or 3,
- $R^{L06}$ is a monovalent hydrocarbon group of 1 to 8 carbon atoms which may contain a hetero atom or a substituted or unsubstituted aryl group of 6 to 20 carbon atoms,
- $R^{L07}$ to $R^{L16}$ independently represent hydrogen or monovalent hydrocarbon groups of 1 to 15 carbon atoms which optionally contains a hetero atom, and alternatively, $R^{L07}$ to $R^{L16}$, taken together, form a ring, wherein each of $R^{L07}$ to $R^{L16}$ represents a divalent $C_1$–C15 hydrocarbon group which may contain a hetero atom, and two of $R^{L07}$ to $R^{L16}$ which are attached to adjoining carbon atoms optionally bond together directly to form a double bond.

20. A polymer according to claim 17, wherein p is 0 and Z is methylene, ethylene, trimethylene, tetramethylene, pentamethylene, hexamethylene, 1,2-propanediyl, 1,3-butanediyl, 1-oxo-2-oxapropane-1,3-diyl, or 3-methyl-1-oxo-2-oxabutane-1,4-diyl.

21. A polymer according to claim 17, wherein p is 0 and Z is methylene, ethylene, trimethylene, tetramethylene, pentamethylene, hexamethylene, 1,2-propanediyl, 1,3-butanediyl, 1-oxo-2-oxapropane-1,3-diyl, or 3-methyl-1-oxo-2-oxabutane-1,4-diyl.

22. A polymer according to claim 17, wherein $R^8$ and $R^{8'}$ are each independently selected from the groups of the following general formulae (L1) to (L4), tertiary alkyl groups of 4 to 20 carbon atoms, trialkylsilyl groups in which each alkyl moiety has 1 to 6 carbon atoms, and oxoalkyl groups of 4 to 20 carbon atoms

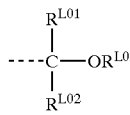

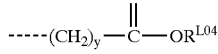

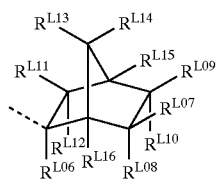

wherein
- $R^{L01}$ and $R^{L02}$ are each independently hydrogen or straight, branched or cyclic alkyl groups of 1 to 18 carbon atoms,
- $R^{L03}$ is a monovalent hydrocarbon group of 1 to 18 carbon atoms, which optionally contains a hetero atom, in which some hydrogen atoms are replaced by hydroxyl, alkoxy, oxo, amino, alkylamino or the like,
- also a pair of $R^{L01}$ and $R^{L02}$, $R^{L01}$ and $R^{L03}$ or $R^{L02}$ and $R^{L03}$ can alternatively form a ring, in which case each of $R^{L01}$, $R^{L02}$ and $R^{L03}$ is a straight or branched alkylene group of 1 to 18 carbon atoms,
- $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1),
- Letter y is an integer of 0 to 6,
- $R^{L05}$ is a monovalent hydrocarbon group of 1 to 8 carbon atoms which may contain a hetero atom or a substituted or unsubstituted aryl group of 6 to 20 carbon atoms,
- Letter m is equal to 0 or 1, n is equal to 0, 1, 2 or 3, and 2m+n is equal to 2 or 3,
- $R^{L06}$ is a monovalent hydrocarbon group of 1 to 8 carbon atoms which may contain a hetero atom or a substituted or unsubstituted aryl group of 6 to 20 carbon atoms,
- $R^{L07}$ to $R^{L16}$ independently represent hydrogen or monovalent hydrocarbon groups of 1 to 15 carbon atoms which optionally contains a hetero atom, and alternatively, $R^{L07}$ to $R^{L16}$, taken together, form a ring, wherein each of $R^{L07}$ to $R^{L16}$ represents a divalent $C_1$–$C_{15}$, hydrocarbon group which may contain a hetero atom, and two of $R^{L07}$ to $R^{L16}$ which are attached to adjoining carbon atoms optionally bond together directly to form a double bond.

23. A tetrahydrofuran compound of the following general formula (5):

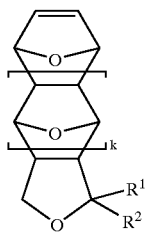

(5)

wherein each of $R^1$ and $R^2$ is hydrogen or a straight, branched or cyclic alkyl group of 1 to 15 carbon atoms, or $R^1$ and $R^2$ taken together may form a ring wherein the combination of $R^1$ with $R^2$ is a straight, branched or cyclic alkylene group of 2 to 15 carbon atoms, and k is equal to 0 or 1.

24. A tetrahydrofuran compound of the following general formula (6):

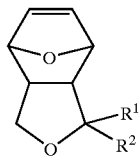

(6)

wherein each of $R^1$ and $R^2$ is hydrogen or a straight, branched or cyclic alkyl group of 1 to 15 carbon atoms, or $R^1$ and $R^2$ taken together may form a ring wherein the combination of $R^1$ with $R^2$ is a straight, branched or cyclic alkylene group of 2 to 15 carbon atoms.

25. A method for preparing a tetrahydrofuran compound of the following general formula (5), comprising the step (a) of subjecting a diol compound of the following general formula (7) to intramolecular dehydration:

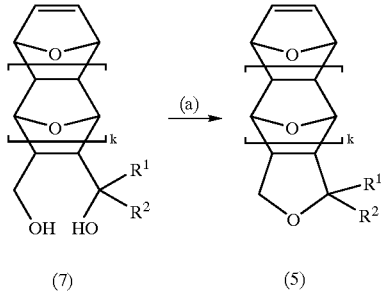

wherein step (a) represents dehydration reaction.
each of $R^1$ and $R^2$ is hydrogen or a straight, branched or cyclic alkyl group of 1 to 15 carbon atoms, or $R^1$ and $R^2$ taken together may form a ring wherein the combination or $R^1$ with $R^2$ is a straight, branched or cyclic alkylne group of 2 to 15 carbon atoms, and k is equal is 0 or 1.

26. A method for preparing a tetrahydrofuran compound of the following general formula (5), comprising the step (a) of converting a diol compound of the following general formula (7) to a compound having an eliminatable group X of the following general formula (8-1) and/or (8-2), and the step (b) of treating the compound with a base for cyclization:

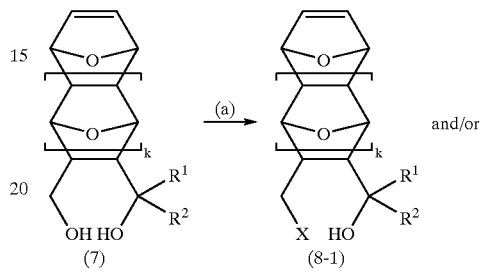

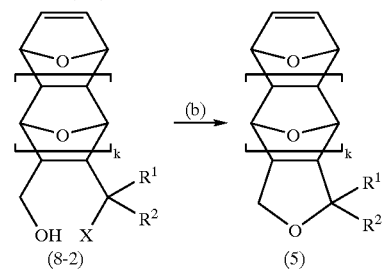

wherein (a) represents halogen-substitution reaction, alkylsulfonylation reaction or arylsulfonylation reaction on hydroxyl, step (b) represents HX-eliminating reaction, each of $R^1$ and $R^2$ is hydrogen or a straight, branched or cyclic alkyl group of 1 to 15 carbon atoms, or $R^1$ and $R^2$ taken together may form a ring wherein the combination or $R^1$ with $R^2$ is a straight, branched or cyclic alkylne group of 2 to 15 carbon atoms, and k is equal is 0 or 1, and X is halogen, alkylsulfonyloxy or arylsulfonyloxy.

* * * * *